(12) United States Patent
Lin et al.

(10) Patent No.: US 8,241,962 B2
(45) Date of Patent: Aug. 14, 2012

(54) METHOD OF MAKING A SEMICONDUCTOR CHIP ASSEMBLY WITH A POST/BASE HEAT SPREADER, A SIGNAL POST AND A CAVITY

(75) Inventors: Charles W. C. Lin, Singapore (SG); Chia-Chung Wang, Hsinchu (TW); Sangwhoo Lim, Johor (MY)

(73) Assignee: Bridge Semiconductor Corporation, Taipei (TW)

( * ) Notice: Subject to any disclaimer, the term of this patent is extended or adjusted under 35 U.S.C. 154(b) by 274 days.

(21) Appl. No.: 12/834,014

(22) Filed: Jul. 12, 2010

(65) Prior Publication Data

US 2011/0059578 A1   Mar. 10, 2011

Related U.S. Application Data

(60) Division of application No. 12/833,947, filed on Jul. 10, 2010, which is a continuation-in-part of application No. 12/642,795, filed on Dec. 19, 2009, which is a continuation-in-part of application No. 12/616,773, filed on Nov. 11, 2009, and a continuation-in-part of application No. 12/616,775, filed on Nov. 11, 2009, said application No. 12/616,773 is a continuation-in-part of application No. 12/557,540, filed on Sep. 11, 2009, and a continuation-in-part of application No. 12/557,541, filed on Sep. 11, 2009, said application No. 12/616,775 is a continuation-in-part of application No. 12/557,540, filed on Sep. 11, 2009, and a continuation-in-part of application No. 12/557,541, filed on Sep. 11, 2009, said application No. 12/557,540 is a continuation-in-part of application No. 12/406,510, filed on Mar. 18, 2009.

(60) Provisional application No. 61/322,912, filed on Apr. 12, 2010, provisional application No. 61/257,830, filed on Nov. 3, 2009, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
  *H01L 21/603* (2006.01)

(52) U.S. Cl. ...................................................... 438/118

(58) Field of Classification Search .................. 257/428, 257/99, E33.056, E33.066, E23.101, E23.01, 257/707, 713, 784, 384, 712, 711, 706, E23.102; 438/26, 27, 122, 612, 39, 121, 118, 464, 438/669, 670
See application file for complete search history.

(56) References Cited

U.S. PATENT DOCUMENTS 3,689,993 A   9/1972   Tolar .............................. 438/380
(Continued)

FOREIGN PATENT DOCUMENTS

JP   2005-166775   6/2005

*Primary Examiner* — Dao H Nguyen
*Assistant Examiner* — Tram H Nguyen
(74) *Attorney, Agent, or Firm* — Jackson IPG PLLC

(57) ABSTRACT

A method of making a semiconductor chip assembly includes providing a thermal post, a signal post and a base, mounting an adhesive on the base including inserting the thermal post into a first opening in the adhesive and the signal post into a second opening in the adhesive, mounting a conductive layer on the adhesive including aligning the thermal post with a first aperture in the conductive layer and the signal post with a second aperture in the conductive layer, then flowing the adhesive upward between the thermal post and the conductive layer and between the signal post and the conductive layer, solidifying the adhesive, providing a conductive trace that includes a pad, a terminal and the signal post, wherein the pad includes a selected portion of the conductive layer, mounting a semiconductor device on the thermal post, wherein a heat spreader includes the thermal post and the base and the semiconductor device extends into a cavity in the thermal post, electrically connecting the semiconductor device to the conductive trace and thermally connecting the semiconductor device to the heat spreader.

35 Claims, 28 Drawing Sheets

U.S. PATENT DOCUMENTS

| | | | |
|---|---|---|---|
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,379,187 A | 1/1995 | Lee et al. | 361/707 |
| 5,457,605 A | 10/1995 | Wagner et al. | 361/720 |
| 5,543,586 A | 8/1996 | Crane, Jr. et al. | 174/262 |
| 5,644,163 A | 7/1997 | Tsuji | 257/706 |
| 5,991,156 A | 11/1999 | Bond et al. | 361/707 |
| 6,057,601 A | 5/2000 | Lau et al. | 257/738 |
| 6,107,683 A | 8/2000 | Castro et al. | 257/700 |
| 6,160,705 A | 12/2000 | Stearns et al. | 361/704 |
| 6,162,664 A | 12/2000 | Kim | 438/126 |
| 6,281,568 B1 | 8/2001 | Glenn et al. | 257/684 |
| 6,313,525 B1 | 11/2001 | Sasano | 257/704 |
| 6,453,549 B1 | 9/2002 | Bhatt et al. | 29/837 |
| 6,495,914 B1 | 12/2002 | Sekine et al. | 257/723 |
| 6,498,355 B1 | 12/2002 | Harrah et al. | 257/99 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,608,376 B1 * | 8/2003 | Liew et al. | 257/698 |
| 6,625,028 B1 * | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,720,651 B2 | 4/2004 | Gaku et al. | 257/707 |
| 6,744,135 B2 | 6/2004 | Hasebe et al. | 257/712 |
| 6,861,750 B2 | 3/2005 | Zhao et al. | 257/739 |
| 6,900,535 B2 | 5/2005 | Zhao | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,196,403 B2 | 3/2007 | Karim | 257/675 |
| 7,335,522 B2 | 2/2008 | Wang et al. | 438/26 |
| 7,470,935 B2 | 12/2008 | Lee et al. | 257/98 |
| 7,495,322 B2 | 2/2009 | Hashimoto et al. | 257/676 |
| 7,582,951 B2 | 9/2009 | Zhao et al. | 257/660 |
| 7,642,137 B2 | 1/2010 | Lin et al. | 438/127 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,812,360 B2 | 10/2010 | Yano | 257/98 |
| 7,956,372 B2 | 6/2011 | Kamada et al. | 257/98 |
| 8,030,676 B2 | 10/2011 | Lin | 257/99 |
| 8,071,998 B2 | 12/2011 | Chen | 257/99 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0024834 A1 | 2/2005 | Newby | 361/719 |
| 2005/0135105 A1 | 6/2005 | Teixeira et al. | 362/294 |
| 2005/0185880 A1 | 8/2005 | Asai | 385/14 |
| 2005/0274959 A1 | 12/2005 | Kim et al. | 257/79 |
| 2006/0012967 A1 | 1/2006 | Asai et al. | 361/764 |
| 2006/0054915 A1 | 3/2006 | Chang | 257/100 |
| 2006/0109632 A1 | 5/2006 | Berlin et al. | 361/719 |
| 2006/0131735 A1 | 6/2006 | Ong et al. | 257/706 |
| 2007/0063213 A1 | 3/2007 | Hsieh et al. | 257/99 |
| 2007/0077416 A1 | 4/2007 | Ito et al. | 428/339 |
| 2007/0090522 A1 | 4/2007 | Alhayek et al. | 257/723 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0173884 A1 | 7/2008 | Chitnis et al. | 257/98 |
| 2008/0180824 A1 | 7/2008 | Endoh et al. | 359/894 |
| 2009/0309213 A1 | 12/2009 | Takahashi et al. | 257/707 |
| 2010/0149756 A1 | 6/2010 | Rowcliffe et al. | 361/714 |
| 2010/0193830 A1 * | 8/2010 | Lin et al. | 257/99 |
| 2010/0291737 A1 | 11/2010 | Ikeguchi et al. | 438/108 |
| 2011/0133204 A1 | 6/2011 | Lai | 257/76 |
| 2011/0163348 A1 * | 7/2011 | Lin et al. | 257/99 |
| 2012/0094442 A1 * | 4/2012 | Lin et al. | 438/118 |

* cited by examiner

METHOD OF MAKING A SEMICONDUCTOR CHIP ASSEMBLY WITH A POST/BASE HEAT SPREADER, A SIGNAL POST AND A CAVITY

CROSS-REFERENCE TO RELATED APPLICATIONS

This application is a divisional of U.S. application Ser. No. 12/833,947 filed Jul. 10, 2010, which is a continuation-in-part of U.S. application Ser. No. 12/642,795 filed Dec. 19, 2009. U.S. application Ser. No. 12/833,947 filed Jul. 10, 2010 also claims the benefit of U.S. Provisional Application Ser. No. 61/322,912 filed Apr. 12, 2010, which is incorporated by reference.

U.S. application Ser. No. 12/642,795 filed Dec. 19, 2009 is a continuation-in-part of U.S. application Ser. No. 12/616,773 filed Nov. 11, 2009 and U.S. application Ser. No. 12/616,775 filed Nov. 11, 2009, each of which is incorporated by reference. U.S. application Ser. No. 12/642,795 filed Dec. 19, 2009 also claims the benefit of U.S. Provisional Application Ser. No. 61/257,830 filed Nov. 3, 2009, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The heat spreader includes a thermal post and a base. The conductive trace includes a pad, a terminal and a signal post. The semiconductor device extends into a cavity in the thermal post, is electrically connected to the conductive trace and is thermally connected to the heat spreader. The thermal post extends upwardly from the base into a first opening in the adhesive, and the signal post extends upwardly from the terminal into a second opening in the adhesive. The conductive trace is located outside the cavity and provides signal routing between the pad and the terminal.

In accordance with an aspect of the present invention, a semiconductor chip assembly includes a semiconductor device, an adhesive, a heat spreader and a conductive trace. The adhesive includes first and second openings. The heat spreader includes a thermal post and a base, wherein the thermal post is adjacent to the base and extends above the base in an upward direction, and the base extends below the thermal post in a downward direction opposite the upward direction and extends laterally from the thermal post in lateral directions orthogonal to the upward and downward directions. The conductive trace includes a pad, a terminal and a signal post, wherein the signal post extends below the pad and above the terminal and an electrically conductive path between the pad and the terminal includes the signal post.

A cavity in the thermal post faces in the upward direction. The semiconductor device extends into the cavity, is electrically connected to the pad and thereby electrically connected to the terminal, and is thermally connected to the thermal post and thereby thermally connected to the base. The adhesive is mounted on and extends above the base, extends laterally from the thermal post to or beyond the terminal and is sandwiched between the base and the pad. The conductive trace is located outside the cavity. The thermal post extends into the first opening and the signal post extends into the second opening. Furthermore, the posts have the same thickness and are coplanar with one another, and the base and the terminal have the same thickness and are coplanar with one another.

The signal post can be adjacent to the pad and the terminal and extend below the pad and above the terminal. The pad can overlap the adhesive, the terminal can be overlapped by the adhesive, and the signal post can extend through the adhesive. The pad, the terminal and the signal post can contact the adhesive, and an electrically conductive path between the pad and the terminal can be the signal post.

In accordance with another aspect of the present invention, a semiconductor chip assembly includes a semiconductor device, an adhesive, a heat spreader, a substrate and a conductive trace. The adhesive includes first and second openings. The heat spreader includes a thermal post and a base, wherein the thermal post is adjacent to the base and extends above the base in an upward direction, and the base extends below the thermal post in a downward direction opposite the upward direction and extends laterally from the thermal post in lateral directions orthogonal to the upward and downward directions. The substrate includes a dielectric layer, and first and second apertures extend through the substrate. The conductive trace includes the pad, a terminal and a signal post, wherein the signal post extends below the pad and above the terminal and an electrically conductive path between the pad and the terminal includes the signal post.

A cavity in the thermal post faces in the upward direction. The semiconductor device is located within the cavity, is electrically connected to the pad and thereby electrically connected to the terminal, and is thermally connected to the thermal post and thereby thermally connected to the base. The adhesive is mounted on and extends above the base and the terminal, extends between the thermal post and the substrate, extends between the signal post and the substrate, extends laterally from the thermal post to or beyond the terminal and is sandwiched between the thermal post and the dielectric layer, between the signal post and the dielectric layer, between the base and the dielectric layer and between the terminal and the dielectric layer. The substrate is mounted on the adhesive and extends above the base. The conductive trace is located outside the cavity. The thermal post extends into the first opening and the first aperture, and the signal post extends into the second opening and the second aperture. Furthermore, the posts have the same thickness and are coplanar with one another, and the base and the terminal have the same thickness and are coplanar with one another.

The heat spreader can consist of the thermal post and the base. The heat spreader can also consist of copper, aluminum or copper/nickel/aluminum. In any case, the heat spreader provides heat dissipation and spreading from the semiconductor device to the next level assembly.

The semiconductor can be mounted on and overlap the thermal post but not the substrate or the conductive trace, be electrically connected to the pad using a wire bond that extends outside the cavity and be thermally connected to the thermal post using a die attach that is located within the cavity. For instance, the semiconductor device can extend within and outside the cavity and the wire bond can be located outside the cavity. Alternatively, the semiconductor device can be located within the cavity and the wire bond can extend within and outside the cavity. In any case, the semiconductor device is located within a periphery of the cavity and the wire bond extends within and outside the periphery of the cavity.

The semiconductor device can be a packaged or unpackaged semiconductor chip. For instance, the semiconductor device can be an LED package that includes an LED chip. Alternatively, the semiconductor device can be a semiconductor chip such as an LED chip.

The adhesive can contact the thermal post, the signal post, the base, the terminal and the dielectric layer. For instance, the adhesive can contact the thermal post and the dielectric layer in a first gap in the first aperture between the thermal post and the substrate, contact the signal post and the dielectric layer in a second gap in the second aperture between the signal post and the substrate, extends across the dielectric layer in the gaps and contact the base, the terminal and the dielectric layer outside the gaps. The adhesive can also laterally surround the posts. The adhesive can also conformally coat sidewalls of the posts and tops of the base and the terminal outside the posts. The adhesive can also fill the space between the posts and the dielectric layer and be contained in the space between the heat spreader and the substrate.

The adhesive can extend laterally from the thermal post to or beyond the terminal. For instance, the adhesive and the terminal can extend to peripheral edges of the assembly. In this instance, the adhesive extends laterally from the thermal post to the terminal. Alternatively, the adhesive can extend to peripheral edges of the assembly and the terminal can be spaced from the peripheral edges of the assembly. In this instance, the adhesive extends laterally from the thermal post beyond the terminal.

The thermal post can be integral with the base. For instance, the thermal post and the base can be a single-piece metal or include a single-piece metal at their interface, and the single-piece metal can be copper. The thermal post can also extend through the first aperture. The thermal post can also be coplanar with the adhesive above the dielectric layer as well as below the dielectric layer at the base. The thermal post can also have a cut-off conical shape in which its diameter decreases as it extends upwardly from the base to its top at the cavity entrance.

The signal post can be integral with the terminal. For instance, the signal post and the terminal can be a single-piece metal or include a single-piece metal at their interface, and the single-piece metal can be copper. The signal post can also extend through the second aperture. The signal post can also be coplanar with the adhesive above the dielectric layer as well as below the dielectric layer at the terminal. The signal post can also have a cut-off conical shape in which its diameter decreases as it extends upwardly from the terminal to its top adjacent to the pad.

The cavity can have a circular, square or rectangular shape in which its diameter increases as it extends upwardly to its entrance.

The base can cover the semiconductor device and the thermal post in the downward direction, support the substrate and be spaced from peripheral edges of the assembly.

The substrate can be spaced from the posts, the terminal and the base. The substrate can also be a laminated structure.

The conductive trace can be spaced from the heat spreader. The pad can contact the adhesive and the dielectric layer, the terminal can contact the adhesive and be spaced from the dielectric layer and the signal post can contact the adhesive and be spaced from the dielectric layer. Furthermore, the terminal can be adjacent to and extend below and laterally from the signal post.

The pad can be an electrical contact for the semiconductor device, the terminal can be an electrical contact for the next level assembly, and the pad and the terminal can provide vertical signal routing between the semiconductor device and the next level assembly.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a thermal post, a signal post and a base, mounting an adhesive on the base including inserting the thermal post into a first opening in the adhesive and the signal post into a second opening in the adhesive, mounting a conductive layer on the adhesive including aligning the thermal post with a first aperture in the conductive layer and the signal post with a second aperture in the conductive layer, then flowing the adhesive upward between the thermal post and the conductive layer and between the signal post and the conductive layer, solidifying the adhesive, providing a conductive trace that includes a pad, a terminal and the signal post, wherein the pad includes a selected portion of the conductive layer, mounting a semiconductor device on the thermal post, wherein a heat spreader includes the thermal post and the base and the semiconductor device extends into a cavity in the thermal post, electrically connecting the semiconductor device to the conductive trace and thermally connecting the semiconductor device to the heat spreader.

In accordance with an aspect of the present invention, a method of making a semiconductor chip assembly includes (1) providing a thermal post, a signal post, a base, an adhesive and a conductive layer, wherein (a) the thermal post is adjacent to the base, extends above the base in an upward direction, extends into a first opening in the adhesive and is aligned with a first aperture in the conductive layer, (b) the signal post is adjacent to the base, extends above the base in the upward direction, extends into a second opening in the adhesive and is aligned with a second aperture in the conductive layer, (c) the base extends below the posts in a downward direction opposite the upward direction and extends laterally from the posts in lateral directions orthogonal to the upward and downward directions, (d) the adhesive is mounted on and extends above the base, is sandwiched between the base and the conductive layer and is non-solidified, and (e) the conductive layer is mounted on and extends above the adhesive, then (2) flowing the adhesive into and upward in a first gap located in the first aperture between the thermal post and the conductive layer and in a second gap located in the second aperture between the signal post and the conductive layer, (3) solidifying the adhesive, (4) providing a conductive trace that includes a pad, a terminal and the signal post, wherein the pad includes a selected portion of the conductive layer and an electrically conductive path between the pad and the terminal includes the signal post, (5) mounting a semiconductor device on the thermal post, wherein a heat spreader includes the thermal post and the base and the semiconductor device extends into a cavity in the thermal post that faces in the upward direction, (6) electrically connecting the semiconductor device to the pad, thereby electrically connecting the semiconductor device to the terminal, and (7) thermally connecting the semiconductor device to the thermal post, thereby thermally connecting the semiconductor device to the base.

In accordance with another aspect of the present invention, a method of making a semiconductor chip assembly includes (1) providing a thermal post, a signal post and a base, wherein the thermal post is adjacent to and integral with the base and extends above the base in an upward direction, the signal post is adjacent to and integral with the base and extends above the base in the upward direction, and the base extends below the posts in a downward direction opposite the upward direction and extends laterally from the posts in lateral directions orthogonal to the upward and downward directions, (2) providing an adhesive, wherein first and second openings extend through the adhesive, (3) providing a conductive layer, wherein first and second apertures extend through the conductive layer, (4) mounting the adhesive on the base, including inserting the thermal post into the first opening and the signal post into the second opening, wherein the adhesive extends above the base, the thermal post extends into the first opening and the signal post extends into the second opening, (5) mounting the conductive layer on the adhesive, including aligning the thermal post with the first aperture and the signal post with the second aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the thermal post upward in the first aperture, moving the signal post upward in the second aperture and applying pressure to the molten adhesive between the base and the conductive layer, wherein the pressure forces the molten adhesive to flow into and upward in a first gap located in the first aperture between the thermal post and the conductive layer and in a second gap located in the second aperture between the signal post and the conductive layer, (8) applying heat to solidify the molten adhesive, thereby mechanically attaching the posts and the base to the conductive layer, then (9) providing a conductive trace that includes a pad, a terminal and the signal post, wherein the pad includes a selected portion of the conductive layer and an electrically conductive path between the pad and the terminal includes the signal post, (10) mounting a semiconductor device on a heat spreader that includes the thermal post and the base, wherein the semiconductor device extends into a cavity in the thermal post that faces in the upward direction, (11) electrically connecting the semiconductor device to the pad, thereby electrically connecting the semiconductor device to the terminal, and (12) thermally connecting the semiconductor device to the thermal post, thereby thermally connecting the semiconductor device to the base.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace.

In accordance with another aspect of the present invention, a method of making a semiconductor chip assembly includes (1) providing a thermal post, a signal post, a base, an adhesive and a substrate, wherein (a) the thermal post is adjacent to the base, extends above the base in an upward direction, extends through a first opening in the adhesive and extends into a first aperture in the substrate, (b) the signal post is adjacent to the base, extends above the base in the upward direction, extends through a second opening in the adhesive and extends into a second aperture in the substrate, (c) the base extends below the posts in a downward direction opposite the upward direction and extends laterally from the posts in lateral directions orthogonal to the upward and downward directions, (d) the adhesive is mounted on and extends above the base, is sandwiched between the base and the substrate and is non-solidified, and (e) the substrate is mounted on and extends above the adhesive, wherein the substrate includes a conductive layer and a dielectric layer and the conductive layer extends above the dielectric layer, then (2) flowing the adhesive into and upward in a first gap located in the first aperture between the thermal post and the substrate and in a second gap located in the second aperture between the signal post and the substrate, (3) solidifying the adhesive, then (4) providing a conductive trace that includes a pad, a terminal and the signal post, wherein the pad includes a selected portion of the conductive layer and an electrically conductive path between the pad and the terminal includes the signal post, (5) mounting a semiconductor device on the thermal post, wherein a heat spreader includes the thermal post and the base and the semiconductor device extends into a cavity in the thermal post that faces in the upward direction, (6) electrically connecting the semiconductor device to the pad, thereby electrically connecting the semiconductor device to the terminal, and (7) thermally connecting the semiconductor device to the thermal post, thereby thermally connecting the semiconductor device to the base.

In accordance with another aspect of the present invention, a method of making a semiconductor chip assembly includes (1) providing a thermal post, a signal post and a base, wherein the thermal post is adjacent to and integral with the base and extends above the base in an upward direction, the signal post is adjacent to and integral with the base and extends above the base in the upward direction, and the base extends below the posts in a downward direction opposite the upward direction and extends laterally from the posts in lateral directions orthogonal to the upward and downward directions, (2) providing an adhesive, wherein first and second openings extend through the adhesive, (3) providing a substrate that includes a conductive layer and a dielectric layer, wherein first and second apertures extend through the substrate, (4) mounting the adhesive on the base, including inserting the thermal post through the first opening and the signal post through the second opening, wherein the adhesive extends above the base, the thermal post extends through the first opening and the signal post extends through the second opening, (5) mounting the substrate on the adhesive, including inserting the thermal post into the first aperture and the signal post into the second aperture, wherein the substrate extends above the adhesive, the conductive layer extends above the dielectric layer and the adhesive is sandwiched between the base and the substrate and is non-solidified, then (6) applying heat to melt the adhesive, (7) moving the base and the substrate towards one another, thereby moving the thermal post upward in the first aperture, moving the signal post upward in the second aperture and applying pressure to the molten adhesive between the base and the substrate, wherein the pressure forces the molten adhesive to flow into and upward in a first gap located in the first aperture between the thermal post and the substrate and in a second gap located in the second aperture between the signal post and the substrate, (8) applying heat to solidify the molten adhesive, thereby mechanically attaching the posts and the base to the substrate, then (9) providing a conductive trace that includes a pad, a terminal and the signal post, wherein the pad includes a selected portion of the conductive layer and an electrically conductive path between the pad and the terminal includes the signal post, (10) mounting a semiconductor device on a heat spreader that includes the thermal post and the base, wherein the semiconductor device extends into a cavity in the thermal post that faces in the upward direction, (11) electrically connecting the semiconductor device to the pad, thereby electrically connecting the semiconductor device to the terminal, and (12) thermally connecting the semiconductor device to the thermal post, thereby thermally connecting the semiconductor device to the base.

Providing the thermal post, the signal post and the base can include providing a metal plate, forming an etch mask on the metal plate that selectively exposes the metal plate and defines the posts, etching the metal plate in a pattern defined by the etch mask, thereby forming a recess in the metal plate that extends into but not through the metal plate, and then removing the etch mask, wherein the thermal post includes a first unetched portion of the metal plate that protrudes above the base and is laterally surrounded by the recess, the signal post includes a second unetched portion of the metal plate that protrudes above the base and is laterally surrounded by the recess, and the base is an unetched portion of the metal plate below the posts and the recess.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the pad can include removing selected portions of the conductive layer after solidifying the adhesive.

Providing the pad can also include grinding the posts, the adhesive and the conductive layer after solidifying the adhesive such that the posts, the adhesive and the conductive layer are laterally aligned with one another at a top lateral surface that faces in the upward direction, and then removing selected portions of the conductive layer such that the pad includes selected portions of the conductive layer. The grinding can include grinding the adhesive without grinding the posts and then grinding the posts, the adhesive and the conductive layer. The removing can include applying a wet chemical etch to the conductive layer using an etch mask that defines the pad.

Providing the pad can also include depositing a second conductive layer on the posts, the adhesive and the conductive layer after the grinding and then removing selected portions of the conductive layers such that the pad includes selected portions of the conductive layers. Depositing the second conductive layer can include electrolessly plating a first plated layer on the posts, the adhesive and the conductive layer and then electroplating a second plated layer on the first plated layer. The removing can include applying the wet chemical etch to the conductive layers using the etch mask to define the pad.

Providing the terminal can include removing selected portions of the base after solidifying the adhesive. The removing can include applying a wet chemical etch to the base using an etch mask to define the terminal such that the terminal includes an unetched portion of the base that is adjacent to the signal post and is spaced and separated from and no longer part of the base. Thus, the pad and the terminal can be formed simultaneously using the same wet chemical etch and different etch masks.

Providing the cavity can include etching the metal plate or the thermal post before or after solidifying the adhesive. For instance, the thermal post and the cavity can be formed simultaneously by etching the metal plate using the etch mask to define the thermal post and the cavity before solidifying the adhesive. Alternatively, the cavity can be formed by etching the thermal post using a different etch mask after solidifying the adhesive. Thus, the thermal post and the cavity can be formed simultaneously using the same etch mask or sequentially using different etch masks.

Providing the cavity can include etching the thermal post before, during or after removing the selected portions of the conductive layer to form the pad. For instance, the pad and the cavity can be formed simultaneously by etching the first and second conductive layers using the etch mask to define the pad and the cavity. Alternatively, the cavity can be formed by etching the thermal post using a different etch mask after forming the pad. Thus, the pad and the cavity can be formed simultaneously using the same etch mask or sequentially using different etch masks.

Flowing the adhesive can include filling the gaps with the adhesive. Flowing the adhesive can also include squeezing the adhesive through the gaps, above the posts and the substrate and on top surface portions of the posts and the substrate adjacent to the gaps.

Solidifying the adhesive can include mechanically bonding the posts and the base to the substrate.

Mounting the semiconductor device can include providing a die attach between a semiconductor chip and the thermal post, electrically connecting the semiconductor device can include providing a wire bond between the chip and the pad, and thermally connecting the semiconductor device can include providing the die attach between the chip and the thermal post.

The adhesive can contact the posts, the base, the pad, the terminal and the dielectric layer, cover the substrate in the downward direction, cover and surround the posts and the base in the lateral directions and extend to peripheral edges of the assembly after the assembly is manufactured and detached from other assemblies in a batch.

The base can cover the semiconductor device and the thermal post in the downward direction, support the substrate and be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The thermal post and the base can be integral with one another and the signal post and the terminal can be integral with one another, thereby enhancing reliability. The cavity can focus the light generated by an LED chip mounted on the thermal post within the cavity, thereby enhancing the light output. The adhesive can be sandwiched between the thermal post and the substrate and between the base and the substrate, thereby providing a robust mechanical bond between the heat spreader and the substrate. The adhesive can also be sandwiched between the signal post and the substrate and between the terminal and the substrate, thereby providing a robust mechanical bond between the conductive trace and the substrate. The conductive trace can provide signal routing with simple circuitry patterns or flexible multi-layer signal routing with complex circuitry patterns. The conductive trace can also provide vertical signal routing between the pad above the dielectric layer and the terminal below the adhesive. The base can provide mechanical support for the substrate, thereby preventing warping. The thermal board top surface can be almost entirely a highly reflective metal, thereby increasing light output from an LED chip mounted on the thermal post in the cavity. The assembly need not contain a solder mask, thereby reducing cost. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
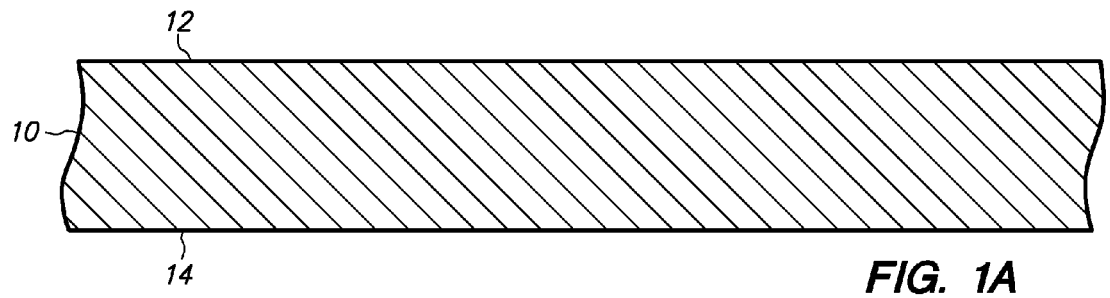
FIGS. 1A-1D are cross-sectional views showing a method of making a thermal post, a signal post and a base in accordance with an embodiment of the present invention.
Figure 1B:
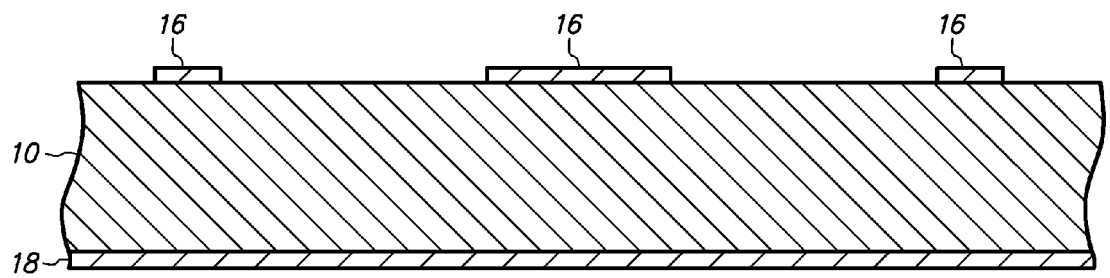
Figure 1C:
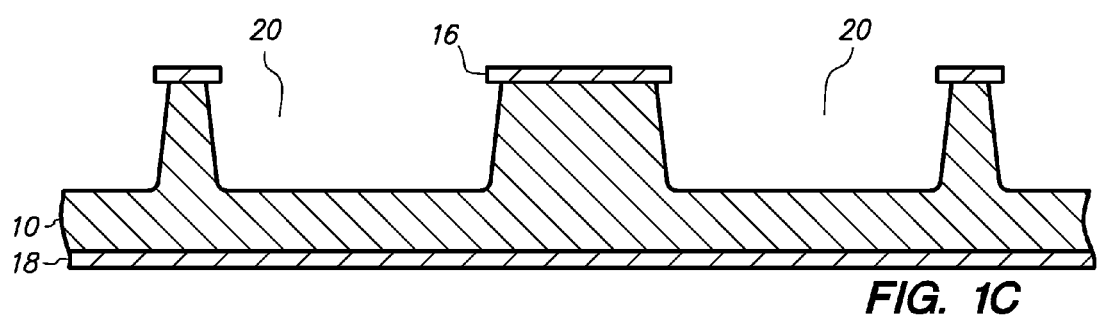
Figure 1D:
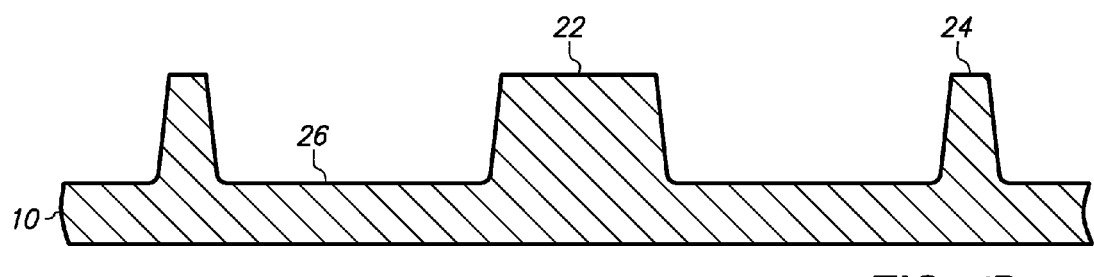
Figure 1E:
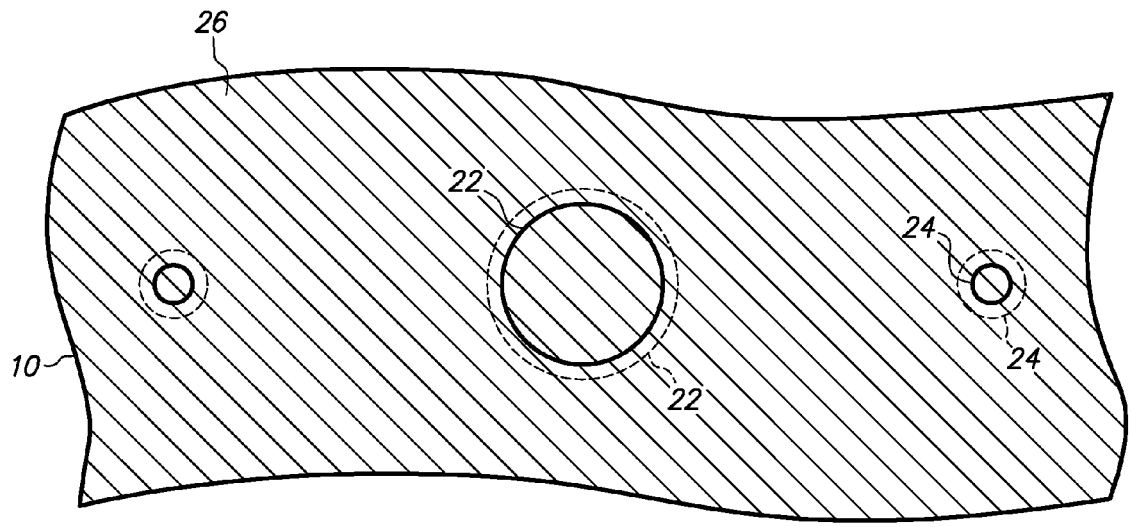
FIGS. 1E and 1F are top and bottom views, respectively, corresponding to FIG. 1D.
Figure 1F:
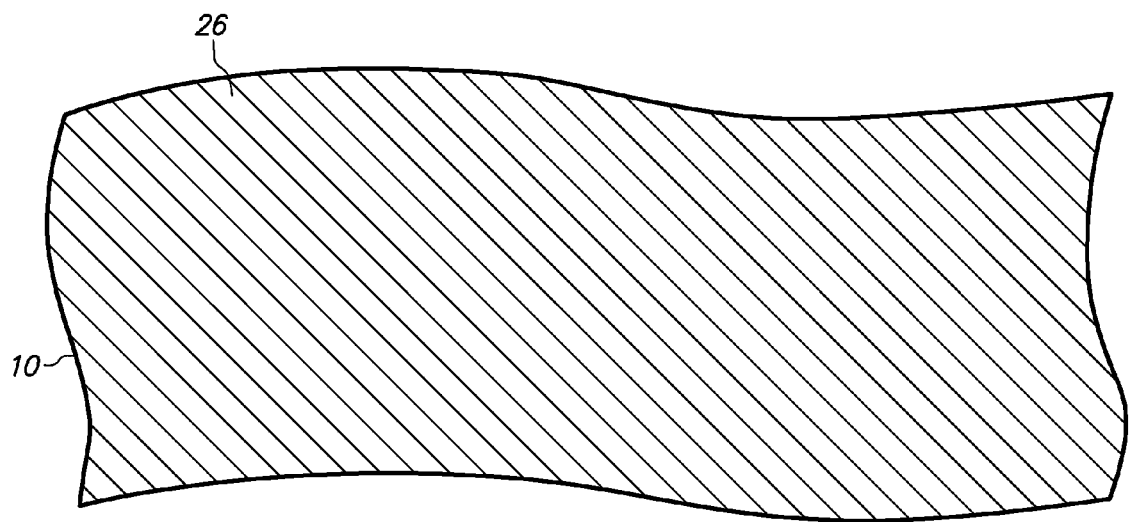

FIGS. 1A-1D are cross-sectional views showing a method of making a thermal post, a signal post and a base in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 400 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch mask 16 and cover mask 18 formed on metal plate 10. Etch mask 16 and cover mask 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through metal plate 10 by etching metal plate 10 in the pattern defined by etch mask 16. The etching is illustrated as a front-side wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides back-side protection. The wet chemical etch is highly selective of copper and etches 250 microns into metal plate 10. As a result, recess 20 extends from surface 12 into but not through metal plate 10, is spaced from surface 14 by 150 microns and has a depth of 250 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1D, 1E and 1F are cross-sectional, top and bottom views, respectively, of metal plate 10 after etch mask 16 and cover mask 18 are removed. The photoresist layers are stripped using a solvent, such as a strong alkaline solution containing potassium hydroxide with a pH of 14, that is highly selective of photoresist with respect to copper.

Metal plate 10 as etched includes thermal post 22, signal post 24 and base 26.

Thermal post 22 is a first unetched portion of metal plate 10 defined by etch mask 16. Thermal post 22 is adjacent to and integral with and protrudes above base 26 and is laterally surrounded by recess 20. Thermal post 22 has a height of 250 microns (recess 20 depth), a diameter at its top surface (circular portion of surface 12) of 2200 microns and a diameter at its bottom (circular portion adjacent to base 26) of 2400 microns. Thus, thermal post 22 has a cut-off conical shape (resembling a frustum) with tapered sidewalls in which its diameter decreases as it extends upwardly from base 26 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Signal post 24 is a second unetched portion of metal plate 10 defined by etch mask 16. Signal post 24 is adjacent to and integral with and protrudes above base 26 and is laterally surrounded by recess 20 and laterally spaced from thermal post 22. Signal post 24 has a height of 250 microns (recess 20 depth), a diameter at its top surface (circular portion of surface 12) of 300 microns and a diameter at its bottom (circular portion adjacent to base 26) of 400 microns. Thus, signal post 24 has a cut-off conical shape (resembling a frustum) with tapered sidewalls in which its diameter decreases as it extends upwardly from base 26 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 26 is an unetched portion of metal plate 10 that is below posts 22 and 24, covers posts 22 and 24 in the downward direction, extends laterally from posts 22 and 24 in a lateral plane (with lateral directions such as left and right) and has a thickness of 150 microns (400-250).

Thus, posts 22 and 24 have the same thickness and are coplanar with one another and are adjacent to and separated by recess 20.

Thermal post 22, signal post 24 and base 26 can be treated to improve bondability to epoxy and solder. For instance, posts 22 and 24 and base 26 can be chemically oxidized or microetched to provide rougher surfaces.

Thermal post 22, signal post 24 and base 26 are illustrated as a subtractively formed single-piece metal (copper). Posts 22 and 24 and base 26 can also be a stamped single-piece metal formed by stamping metal plate 10 with a contact piece with a first recess or hole that defines thermal post 22 and a second recess or hole that defines signal post 24. Posts 22 and 24 can also be formed additively by depositing posts 22 and 24 on base 26 using electroplating, chemical vapor deposition (CVD), physical vapor deposition (PVD) and so on, for instance by electroplating a solder thermal post 22 and a solder signal post 24 on a copper base 26, in which case thermal post 22 and base 26 have a metallurgical interface and are adjacent to but not integral with one another and signal post 24 and base 26 have a metallurgical interface and are adjacent to but not integral with one another. Posts 22 and 24 can also be formed semi-additively, for instance by depositing upper portions of posts 22 and 24 on etch-defined lower portions of posts 22 and 24. Posts 22 and 24 can also be formed semi-additively by depositing conformal upper portions of posts 22 and 24 on etch-defined lower portions of posts 22 and 24. Posts 22 and 24 can also be sintered to base 26.

Figure 2A:
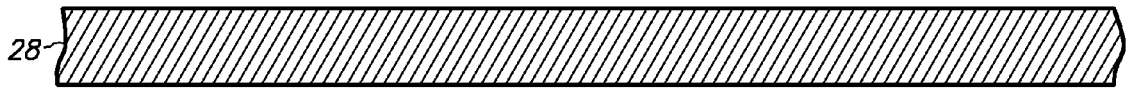
FIGS. 2A and 2B are cross-sectional views showing a method of making an adhesive in accordance with an embodiment of the present invention.
Figure 2B:
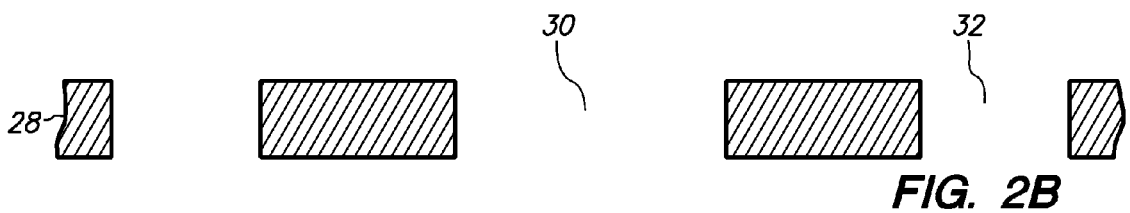
Figure 2C:
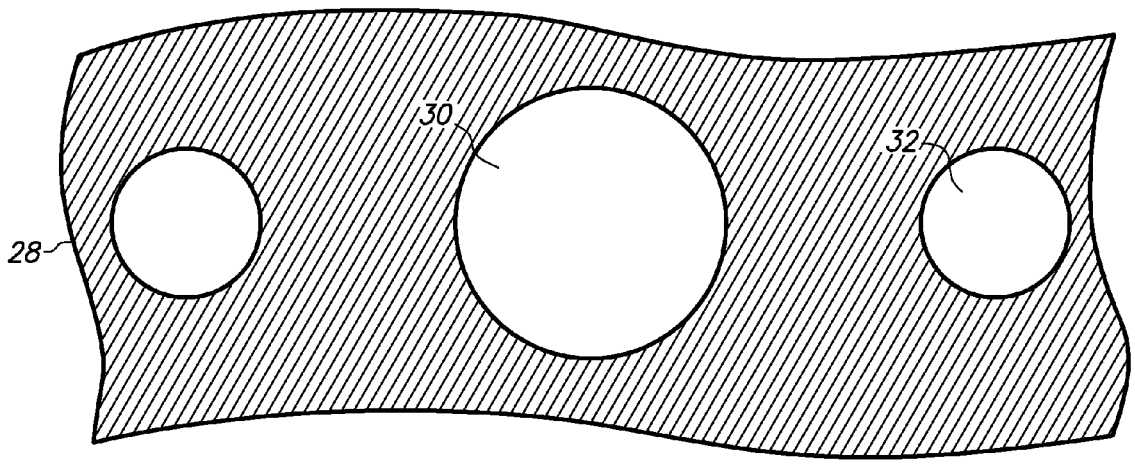
FIGS. 2C and 2D are top and bottom views, respectively, corresponding to FIG. 2B.
Figure 2D:
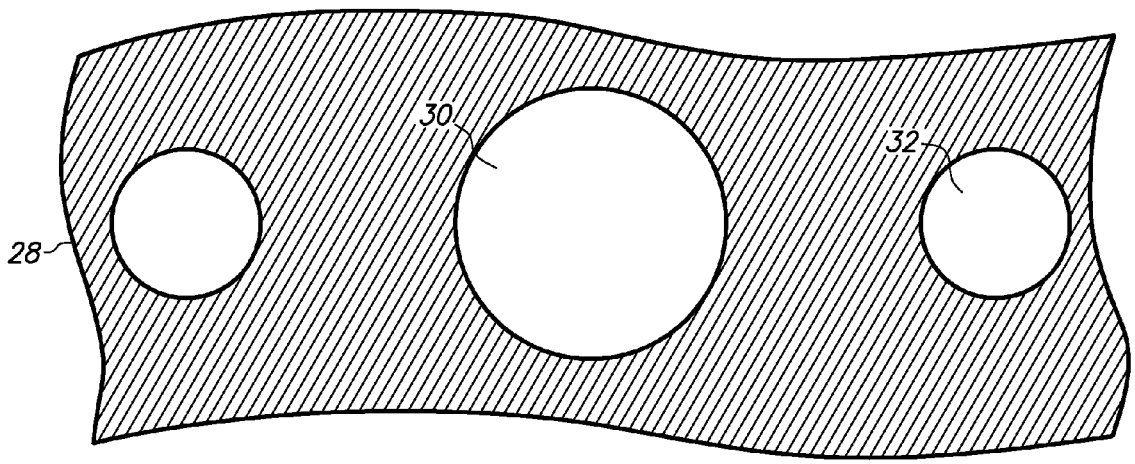

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 28. Adhesive 28 is illustrated as a prepreg with B-stage uncured epoxy provided as a non-solidified unpatterned sheet with a thickness of 150 microns.

Adhesive 28 can be various dielectric films or prepregs formed from numerous organic or inorganic electrical insulators. For instance, adhesive 28 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wisconsin are suitable.

FIGS. 2B, 2C and 2D are cross-sectional, top and bottom views, respectively, of adhesive 28 with openings 30 and 32. Opening 30 is a first window that extends through adhesive 28 and has a diameter of 2450 microns, and opening 32 is a second window that extends through adhesive 28 and has a diameter of 450 microns. Openings 30 and 32 are formed by mechanical drilling through the prepreg and can be formed by other techniques such as punching and stamping.

Figure 3A:
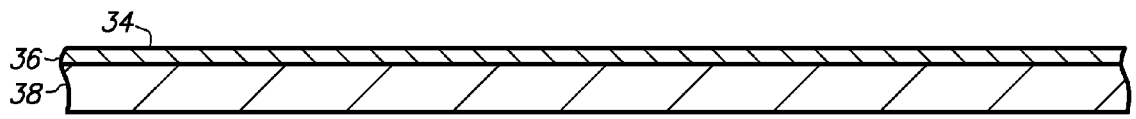
FIGS. 3A and 3B are cross-sectional views showing a method of making a substrate in accordance with an embodiment of the present invention.
Figure 3B:
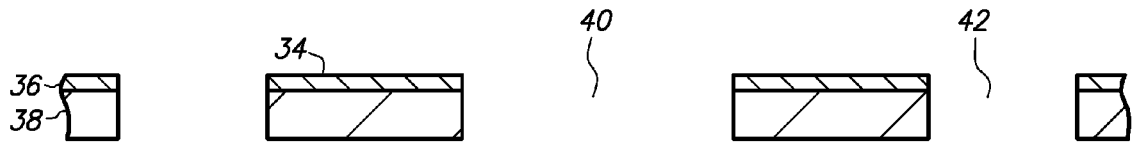
Figure 3C:
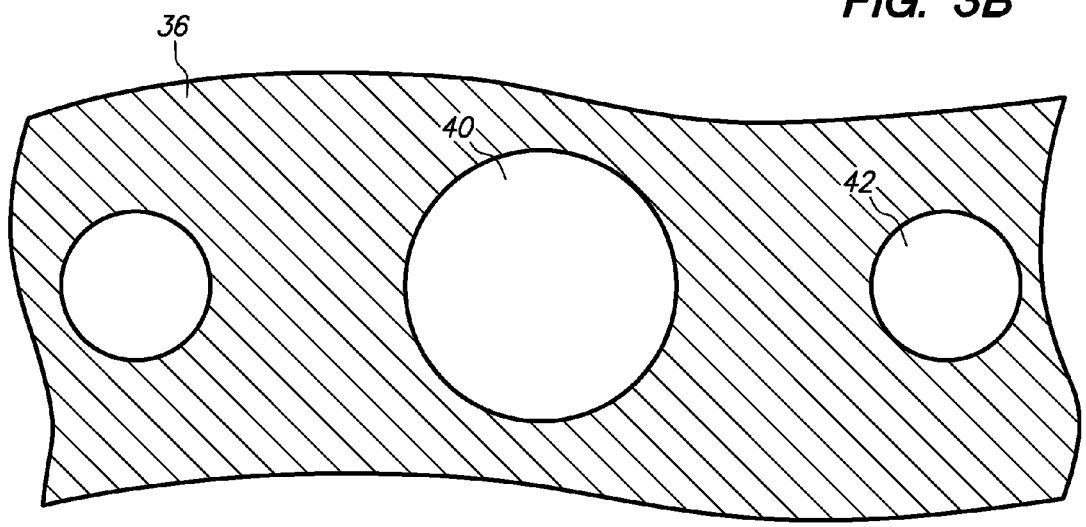
FIGS. 3C and 3D are top and bottom views, respectively, corresponding to FIG. 3B.
Figure 3D:
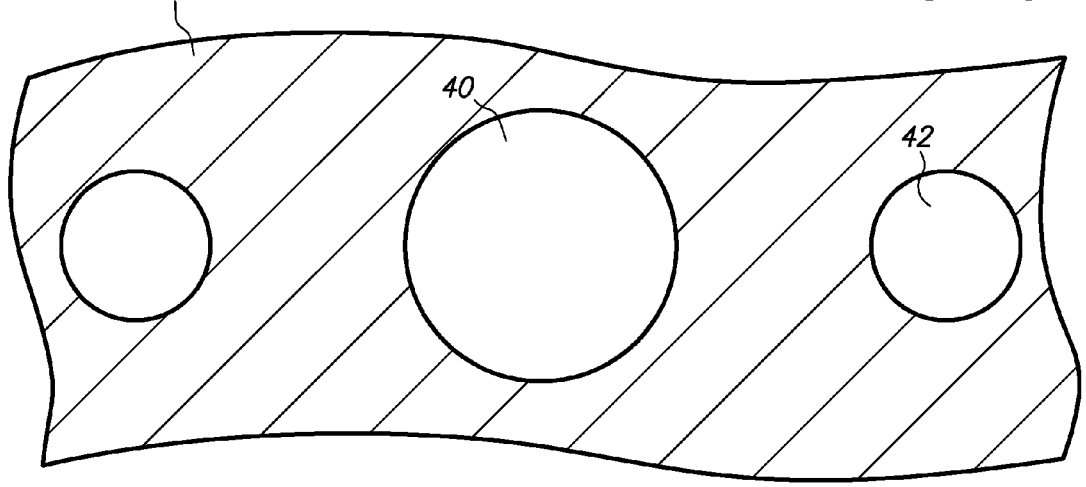

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 34 that includes conductive layer 36 and dielectric layer 38. Conductive layer 36 is an electrical conductor that contacts and extends above dielectric layer 38, and dielectric layer 38 is an electrical insulator. For instance, conductive layer 36 is an unpatterned copper sheet with a thickness of 30 microns, and dielectric layer 38 is epoxy with a thickness of 130 microns.

FIGS. 3B, 3C and 3D are cross-sectional, top and bottom views, respectively, of substrate 34 with apertures 40 and 42. Aperture 40 is a first window that extends through substrate 34 and has a diameter of 2450 microns, and aperture 42 is a second window that extends through substrate 34 and has a diameter of 450 microns. Apertures 40 and 42 are formed by mechanical drilling through conductive layer 36 and dielectric layer 38 and can be formed with other techniques such as punching and stamping. Preferably, opening 30 and aperture 40 have the same diameter and are formed in the same manner with the same drill bit at the same drilling station, and opening 32 and aperture 42 have the same diameter and are formed in the same manner with the same drill bit at the same drilling station.

Substrate 34 is illustrated as a laminated structure. Substrate 34 can be other electrical interconnects such as a ceramic board or a printed circuit board. Likewise, substrate 34 can include additional layers of embedded circuitry.

Figure 4A:
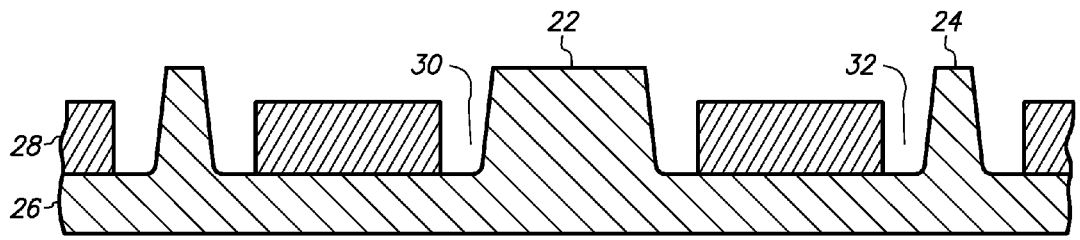
FIGS. 4A-4N are cross-sectional views showing a method of making a thermal board with a substrate on an adhesive in accordance with an embodiment of the present invention.
Figure 4B:
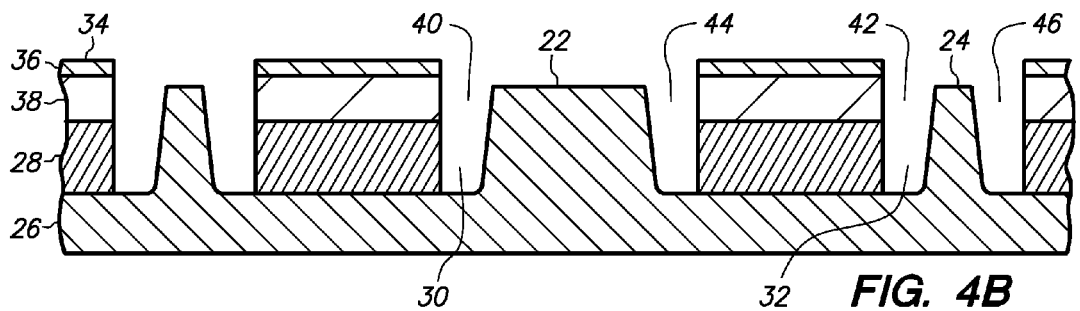
FIGS. 4O and 4P are top and bottom views, respectively, corresponding to FIG. 4N.
Figure 4C:
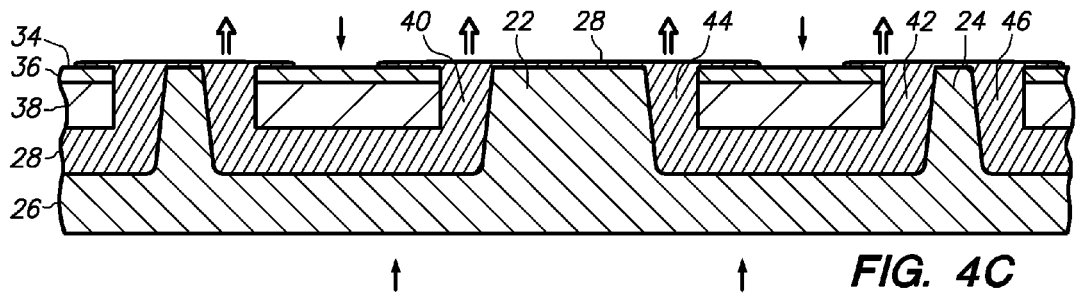
Figure 4D:
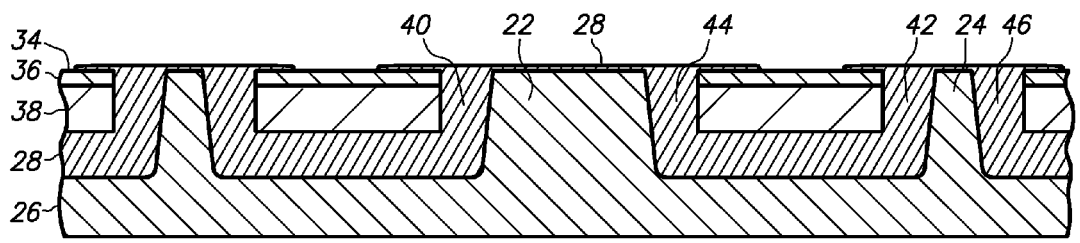
Figure 4E:
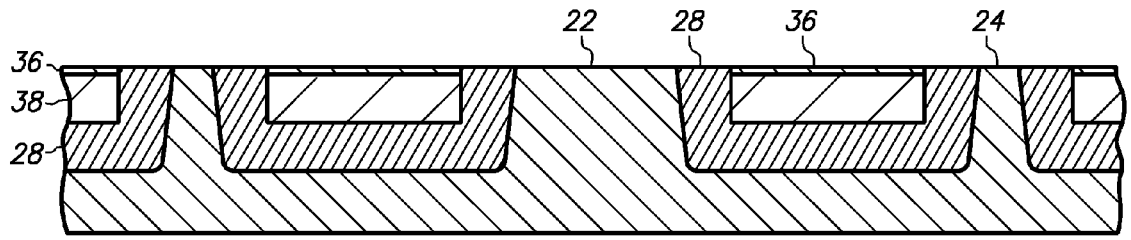
Figure 4F:
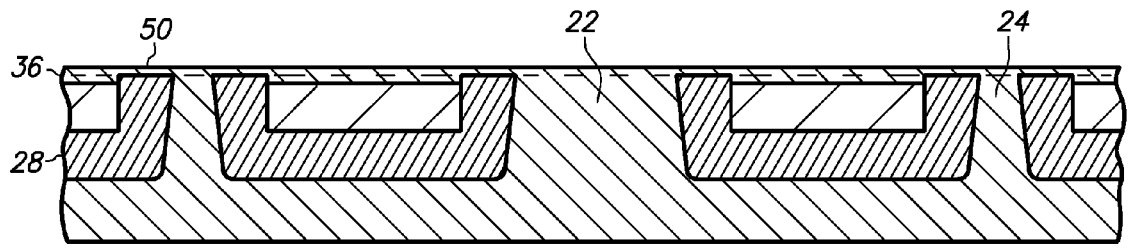
Figure 4G:
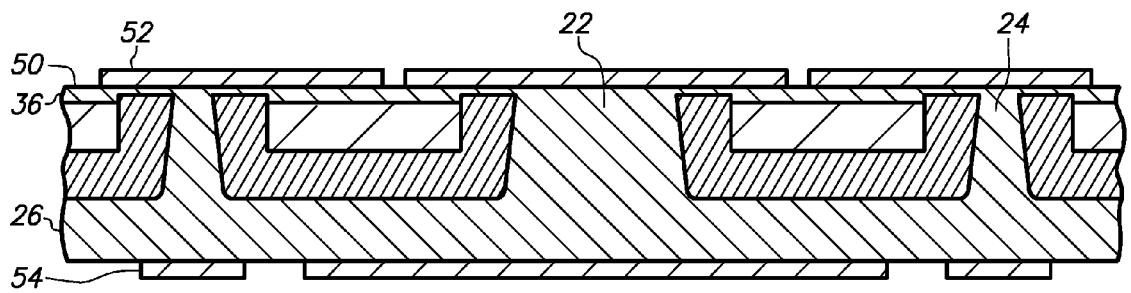
Figure 4H:
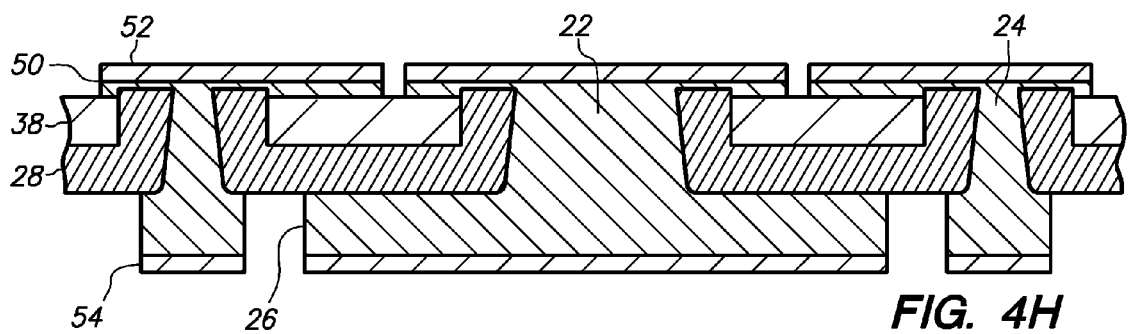
Figure 4I:
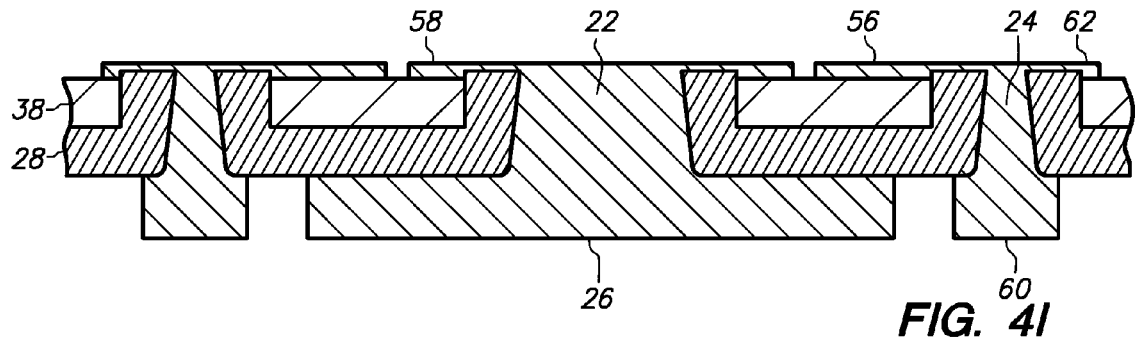
Figure 4J:
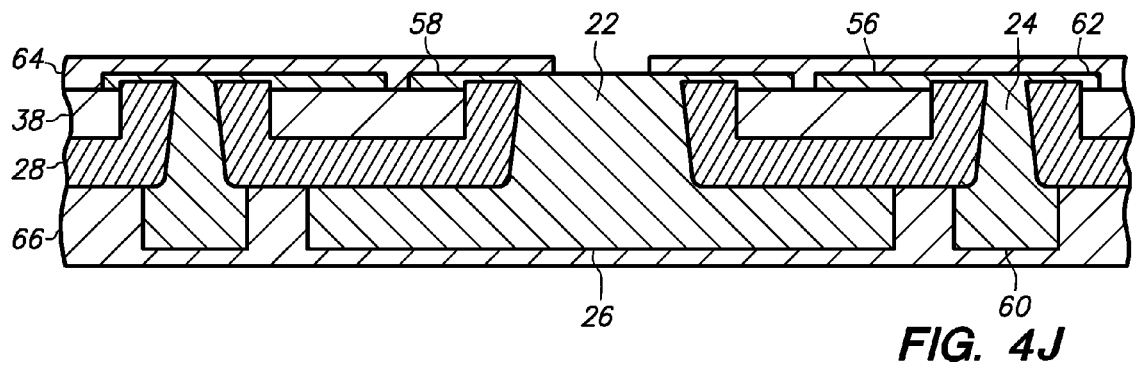
Figure 4K:
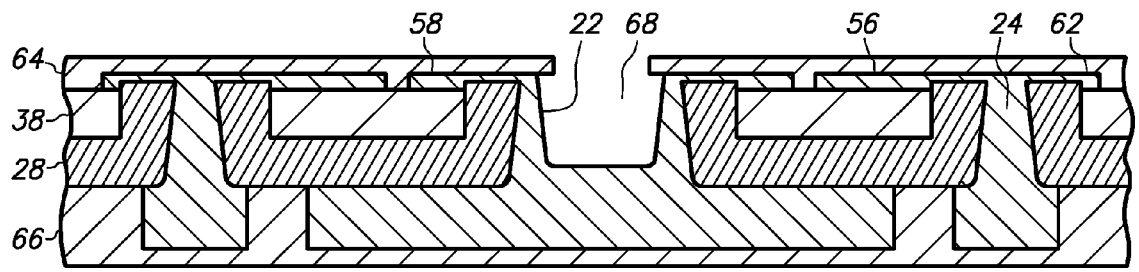
Figure 4L:
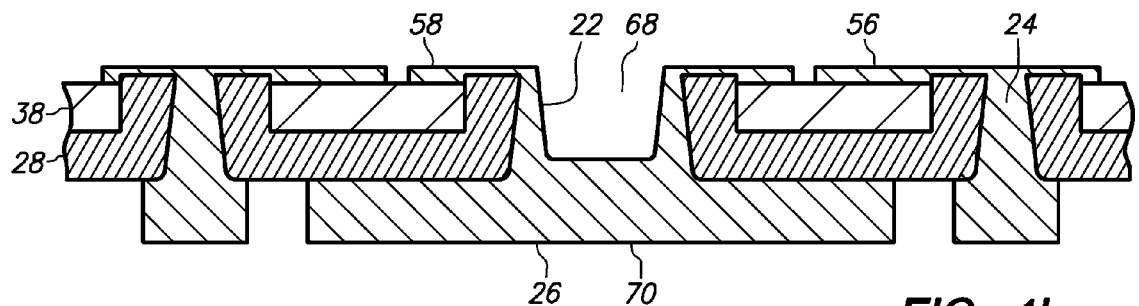
Figure 4M:
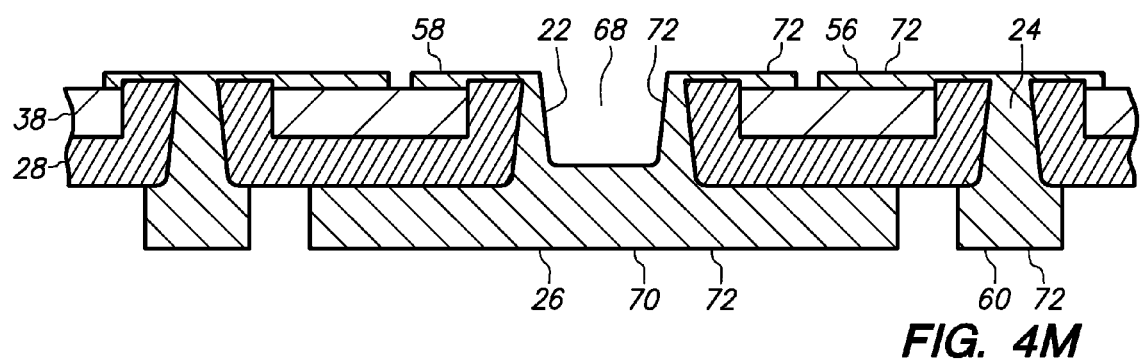
Figure 4N:
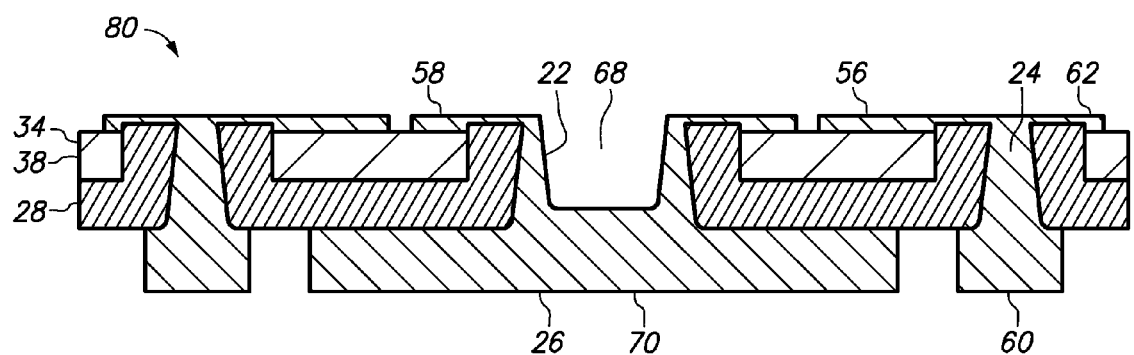
Figure 40:
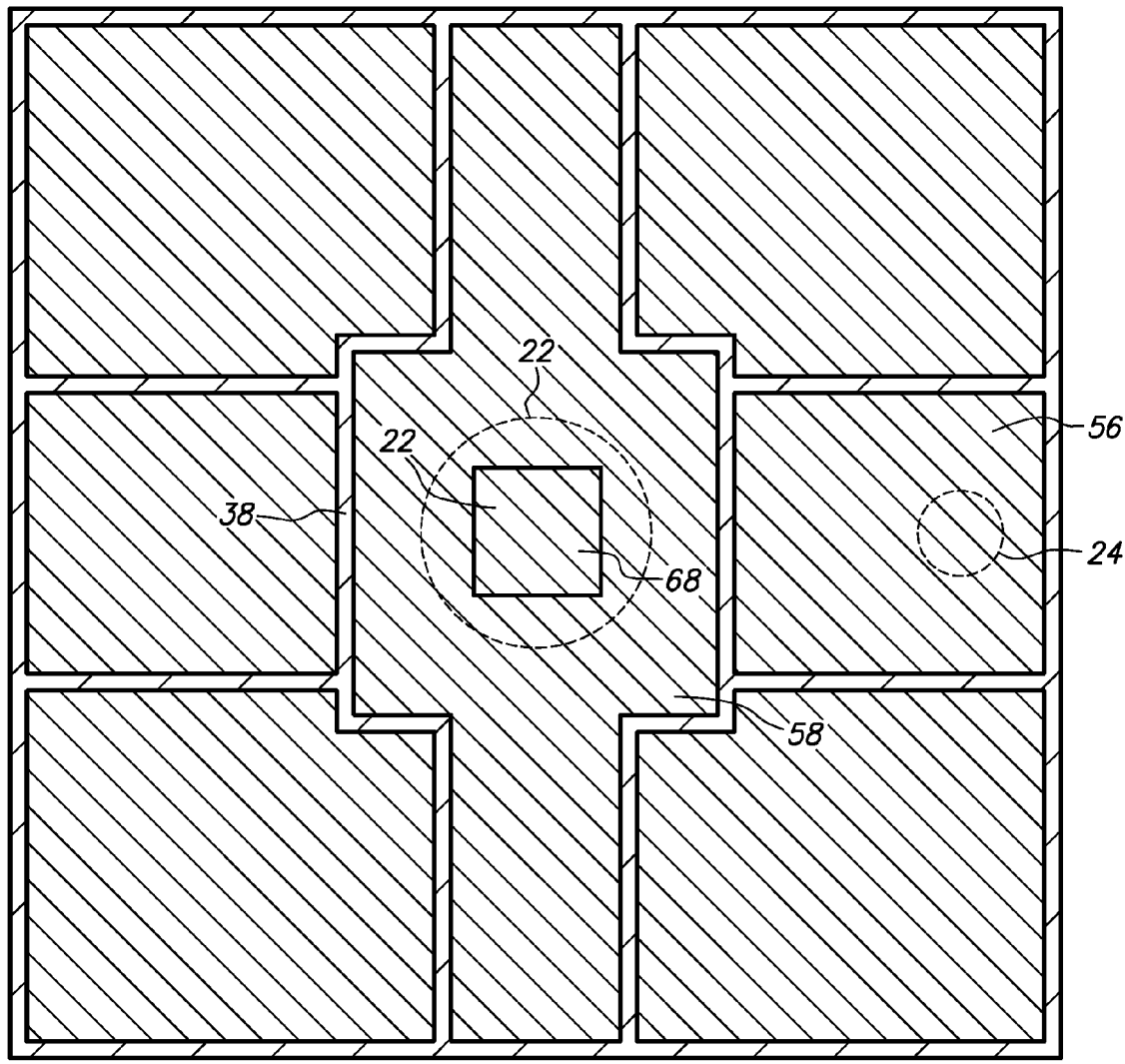
Figure 4P:
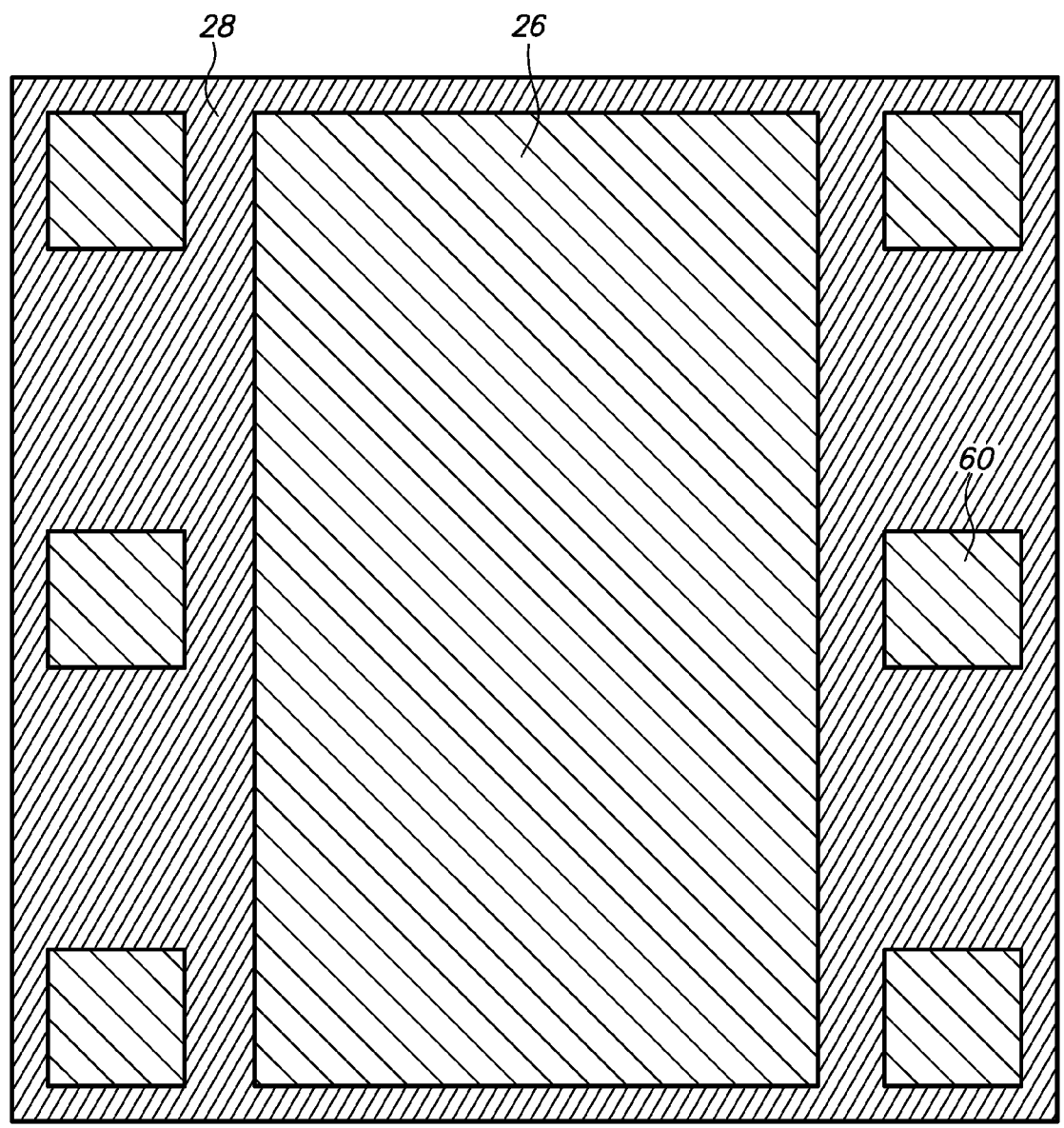

FIGS. 4A-4N are cross-sectional views showing a method of making a thermal board that includes thermal post 22, signal post 24, base 26, adhesive 28 and substrate 34 in accordance with an embodiment of the present invention, and FIGS. 4O and 4P are top and bottom views, respectively, corresponding to FIG. 4N.

FIG. 4A is a cross-sectional view of the structure with adhesive 28 mounted on base 26. Adhesive 28 is mounted by lowering it onto base 26 as thermal post 22 is inserted into and through and upwards in opening 30 and signal post 24 is inserted into and through and upwards in opening 32. Adhesive 28 eventually contacts and rests on base 26. Preferably, thermal post 22 is inserted into and extends through opening 30 without contacting adhesive 28 and is aligned with and centrally located within opening 30, and signal post 24 is inserted into and extends through opening 32 without contacting adhesive 28 and is aligned with and centrally located within opening 32.

FIG. 4B is a cross-sectional view of the structure with substrate 34 mounted on adhesive 28. Substrate 34 is mounted by lowering it onto adhesive 28 as thermal post 22 is inserted into and upwards in aperture 40 and signal post 24 is inserted into and upwards in aperture 42. Substrate 34 eventually contacts and rests on adhesive 28.

Thermal post 22 is inserted into but not through aperture 40 without contacting substrate 34 and is aligned with and centrally located within aperture 40. As a result, gap 44 is located in aperture 40 between thermal post 22 and substrate 34. Gap 44 laterally surrounds thermal post 22 and is laterally surrounded by substrate 34. In addition, opening 30 and aperture 40 are precisely aligned with one another and have the same diameter.

Signal post 24 is inserted into but not through aperture 42 without contacting substrate 34 and is aligned with and centrally located within aperture 42. As a result, gap 46 is located in aperture 42 between signal post 24 and substrate 34. Gap 46 laterally surrounds signal post 24 and is laterally surrounded by substrate 34. In addition, opening 32 and aperture 42 are precisely aligned with one another and have the same diameter.

At this stage, substrate 34 is mounted on and contacts and extends above adhesive 28. Thermal post 22 extends through opening 30 into aperture 40 to dielectric layer 38, is 60 microns below the top surface of conductive layer 36 and is exposed through aperture 40 in the upward direction. Signal post 24 extends through opening 32 into aperture 42 to dielectric layer 38, is 60 microns below the top surface of conductive layer 36 and is exposed through aperture 42 in the upward direction. Adhesive 28 contacts and is sandwiched between base 26 and substrate 34, contacts dielectric layer 38 but is spaced from conductive layer 36 and remains a non-solidified prepreg with B-stage uncured epoxy, and gaps 44 and 46 are filled with air.

FIG. 4C is a cross-sectional view of the structure with adhesive 28 in gaps 44 and 46. Adhesive 28 is flowed into gaps 44 and 46 by applying heat and pressure. In this illustration, adhesive 28 is forced into gaps 44 and 46 by applying downward pressure to conductive layer 36 and/or upward pressure to base 26, thereby moving base 26 and substrate 34 towards one another and applying pressure to adhesive 28 while simultaneously applying heat to adhesive 28. Adhesive 28 becomes compliant enough under the heat and pressure to conform to virtually any shape. As a result, adhesive 28 sandwiched between base 26 and substrate 34 is compressed, forced out of its original shape and flows into and upward in gaps 44 and 46. Base 26 and substrate 34 continue to move towards one another and adhesive 28 eventually fills gaps 44 and 46. Moreover, adhesive 28 remains sandwiched between and continues to fill the reduced space between base 26 and substrate 34.

For instance, base 26 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between base 26 and the bottom platen. The stack includes the top platen, top cull plate, top buffer paper, substrate 34, adhesive 28, base 26, bottom buffer paper, bottom cull plate and bottom platen in descending order. Furthermore, the stack may be positioned on the bottom platen by tooling pins (not shown) that extend upward from the bottom platen through registration holes (not shown) in base 26.

The platens are heated and move towards one another, thereby applying heat and pressure to adhesive 28. The cull plates disperse the heat from the platens so that it is more uniformly applied to base 26 and substrate 34 and thus adhesive 28, and the buffer papers disperse the pressure from the platens so that it is more uniformly applied to base 26 and substrate 34 and thus adhesive 28. Initially, dielectric layer 38 contacts and presses down on adhesive 28. As the platen motion and heat continue, adhesive 28 between base 26 and substrate 34 is compressed, melted and flows into and upward in gaps 44 and 46 and across dielectric layer 38 to conductive layer 36. For instance, the uncured epoxy is melted by the heat and the molten uncured epoxy is squeezed by the pressure into gaps 44 and 46, however the reinforcement and the filler remain between base 26 and substrate 34. Adhesive 28 elevates more rapidly than thermal post 22 in aperture 40 and fills gap 44, and elevates more rapidly than signal post 24 in aperture 42 and fills gap 46. Adhesive 28 also rises slightly above gaps 44 and 46, overflows onto the top surfaces of thermal post 22 and conductive layer 36 adjacent to gap 44 and overflows onto the top surfaces of signal post 24 and conductive layer 36 adjacent to gap 46 before the platen motion stops. This may occur due to the prepreg being slightly thicker than necessary. As a result, adhesive 28 creates a thin coating on the top surfaces of thermal post 22, signal post 24 and conductive layer 36. The platen motion is eventually blocked by posts 22 and 24 and the platens become stationary but continue to apply heat to adhesive 28.

The upward flow of adhesive 28 in gaps 44 and 46 is shown by the thick upward arrows, the upward motion of posts 22 and 24 and base 26 relative to substrate 34 is shown by the thin upward arrows, and the downward motion of substrate 34 relative to posts 22 and 24 and base 26 is shown by the thin downward arrows.

FIG. 4D is a cross-sectional view of the structure with adhesive 28 solidified.

For instance, the platens continue to clamp thermal post 22, signal post 24 and base 26 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 28 as solidified provides a secure robust mechanical bond between thermal post 22 and substrate 34, between signal post 24 and substrate 34 and between base 26 and substrate 34. Adhesive 28 can withstand normal operating pressure without distortion or damage and is only temporarily distorted under unusually high pressure. Furthermore, adhesive 28 can absorb thermal expansion mismatch between thermal post 22 and substrate 34, between signal post 24 and substrate 34 and between base 26 and substrate 34.

At this stage, thermal post 22, signal post 24 and conductive layer 36 are essentially coplanar with one another and adhesive 28 and conductive layer 36 extend to a top surface that faces in the upward direction. For instance, adhesive 28 between base 26 and dielectric layer 38 has a thickness of 90 microns which is 60 microns less than its initial thickness of 150 microns, thermal post 22 ascends 60 microns in aperture 40, signal post 24 ascends 60 microns in aperture 42 and substrate 34 descends 60 microns relative to posts 22 and 24. The 250 micron height of thermal post 22 and of signal post 24 is essentially the same as the combined height of conductive layer 36 (30 microns), dielectric layer 38 (130 microns) and the underlying adhesive 28 (90 microns). Furthermore, thermal post 22 continues to be centrally located in opening 30 and aperture 40 and spaced from substrate 34, signal post 24 continues to be centrally located in opening 32 and aperture 42 and spaced from substrate 34 and adhesive 28 fills the space between base 26 and substrate 34 and fills gaps 44 and 46. For instance, gap 44 (as well as adhesive 28 between thermal post 22 and substrate 34) has a width of 100 microns ((2400−2200)/2) at the top surface of thermal post 22, and gap 46 (as well as adhesive 28 between signal post 24 and substrate 34) has a width of 75 microns ((450−300)/2) at the top surface of signal post 24. Adhesive 28 extends across dielectric layer 38 in gaps 44 and 46. That is, adhesive 28 in gap 44 extends in the upward and downward directions across the thickness of dielectric layer 38 at the outer sidewall of gap 44, and adhesive 28 in gap 46 extends in the upward and downward directions across the thickness of dielectric layer 38 at the outer sidewall of gap 46. Adhesive 28 also includes thin top portions above gaps 44 and 46 that contact the top surfaces of posts 22 and 24 and conductive layer 36 and extend above posts 22 and 24 by 10 microns.

FIG. 4E is a cross-sectional view of the structure after upper portions of thermal post 22, signal post 24, adhesive 28 and conductive layer 36 are removed.

Thermal post 22, signal post 24, adhesive 28 and conductive layer 36 have their upper portions removed by grinding. For instance, a rotating diamond sand wheel and distilled water are applied to the top of the structure. Initially, the diamond sand wheel grinds only adhesive 28. As the grinding continues, adhesive 28 becomes thinner as its grinded surface migrates downwardly. Eventually the diamond sand wheel contacts posts 22 and 24 and conductive layer 36 (not necessarily at the same time), and as a result, begins to grind posts 22 and 24 and conductive layer 36 as well. As the grinding continues, posts 22 and 24, adhesive 28 and conductive layer 36 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 28, a 15 micron thick upper portion of thermal post 22, a 15 micron thick upper portion of signal post 24 and a 15 micron thick upper portion of conductive layer 36. The decreased thickness does not appreciably affect thermal post 22, signal post 24 or adhesive 28. However, it substantially reduces the thickness of conductive layer 36 from 30 microns to 15 microns.

At this stage, thermal post 22, signal post 24, adhesive 28 and conductive layer 36 are coplanar with one another at a smoothed lapped lateral top surface that is above dielectric layer 38 and faces in the upward direction.

FIG. 4F is a cross-sectional view of the structure with conductive layer 50 deposited on thermal post 22, signal post 24, adhesive 28 and conductive layer 36.

Conductive layer 50 contacts thermal post 22, signal post 24, adhesive 28 and conductive layer 36 and covers them in the upward direction. For instance, the structure is dipped in an activator solution to render adhesive 28 catalytic to electroless copper, then a first copper layer is electrolessly plated on thermal post 22, signal post 24, adhesive 28 and conductive layer 36, and then a second copper layer is electroplated on the first copper layer. The first copper layer has a thickness of 2 microns, the second copper layer has a thickness of 13 microns, and conductive layer 50 has a thickness of 15 microns. As a result, conductive layer 36 essentially grows and has a thickness of 30 microns (15+15). Thus, conductive layer 50 serves as a cover layer for thermal post 22 and signal post 24 and a build-up layer for conductive layer 36. Thermal post 22, signal post 24 and conductive layer 50, and conductive layers 36 and 50 are shown as a single layer for convenience of illustration. The boundary (shown in phantom) between thermal post 22 and conductive layer 50, between signal post 24 and conductive layer 50 and between conductive layers 36 and 50 may be difficult or impossible to detect since copper is plated on copper. However, the boundary between adhesive 28 and conductive layer 50 is clear.

FIG. 4G is a cross-sectional view of the structure with etch mask 52 and etch mask 54 formed on the top and bottom surfaces, respectively, of the structure. Etch masks 52 and 54 are illustrated as photoresist layers similar to photoresist layer 16. Photoresist layer 52 has a pattern that selectively exposes conductive layer 50, and photoresist layer 54 has a pattern that selectively exposes base 26.

FIG. 4H is a cross-sectional view of the structure with selected portions of conductive layers 36 and 50 removed by etching conductive layers 36 and 50 in the pattern defined by etch mask 52, and selected portions of base 26 removed by etching base 26 in the pattern defined by etch mask 54. The etching is a front-side and back-side wet chemical etch similar to the etch applied to metal plate 10. For instance, a top spray nozzle (not shown) and a bottom spray nozzle (not shown) can spray the wet chemical etch on the top and bottom of the structure, or the structure can be dipped in the wet chemical etch. The wet chemical etch etches through conductive layers 36 and 50 to expose dielectric layer 38 in the upward direction and converts conductive layers 36 and 50 from unpatterned into patterned layers. The wet chemical etch also etches through base 26 to expose adhesive 28 in the downward direction.

FIG. 4I is a cross-sectional view of the structure after etch masks 52 and 54 are removed. Photoresist layers 52 and 54 can be stripped in the same manner as photoresist layers 16 and 18.

Conductive layers 36 and 50 as etched include pad 56 and cap 58. Pad 56 and cap 58 are unetched portions of conductive layers 36 and 50 defined by etch mask 52. Thus, conductive layers 36 and 50 are a patterned layer that includes pad 56 and cap 58. Furthermore, thermal post 22 is adjacent to and thermally connects base 26 and cap 58.

Pad 56 is above and adjacent to and covers in the upward direction and extends laterally in the lateral directions from the top of signal post 24. Pad 56 also contacts the underlying portion of adhesive 28 that is coplanar with and adjacent to and laterally surrounds signal post 24 and covers this portion in the upward direction.

Cap 58 is above and adjacent to and covers in the upward direction and extends laterally in the lateral directions from the top of thermal post 22. Cap 58 is positioned so that thermal post 22 is centrally located within its periphery. Cap 58 also contacts the underlying portion of adhesive 28 that is coplanar with and adjacent to and laterally surrounds thermal post 22 and covers this portion in the upward direction.

Base 26 as etched includes base 26, reduced to its central portion, and terminal 60. Base 26 is an unetched portion of base 26 defined by etch mask 54 and extends laterally beyond thermal post 22 by 1000 microns in the lateral directions, and terminal 60 is an unetched portion of base 26 defined by etch mask 54 that is adjacent to and extends below and laterally from signal post 24 and contacts and extends below adhesive 28. Base 26 remains an unpatterned layer, and a patterned layer that is laterally spaced from and outside the periphery of base 26 includes terminal 60. Thus, terminal 60 is spaced and separated from and no longer a part of base 26. Furthermore, signal post 24 is adjacent to and electrically connects pad 56 and terminal 60.

Conductive trace 62 is provided by signal post 24, pad 56 and terminal 60. Similarly, an electrically conductive path between pad 56 and terminal 60 is signal post 24. Conductive trace 62 provides vertical (top to bottom) routing from pad 56 to terminal 60. Conductive trace 62 is not be limited to this configuration. For instance, the electrically conductive path can include vias that extend through dielectric layer 38 and routing lines (above and/or below dielectric layer 38) as well as passive components such as resistors and capacitors mounted on additional pads.

FIG. 4J is a cross-sectional view of the structure with etch mask 64 and cover mask 66 formed on the top and bottom surfaces, respectively, of the structure. Etch mask 64 and cover mask 66 are illustrated as photoresist layers similar to photoresist layers 16 and 18, respectively. Photoresist layer 64 has a pattern that selectively exposes thermal post 22 and covers adhesive 28, substrate 34 and conductive trace 62, and photoresist layer 66 remains unpatterned and covers base 26 and terminal 60.

FIG. 4K is a cross-sectional view of the structure with an upper central portion of thermal post 22 removed by etching thermal post 22 and cap 58 as defined by etch mask 64. The etching is a front-side wet chemical etch similar to the etch applied to metal plate 10. The wet chemical etch etches through cap 58 and into but not through post 22 to create cavity 68 in thermal post 22 and cap 58, and base 26 and conductive trace 62 are not affected.

The wet chemical etch etches 200 microns through cap 58 (15 microns) into thermal post 22 (185 microns). Therefore, it substantially reduces the thickness of thermal post 22 at its central portion beneath cavity 68 from 235 microns (250–15) to 50 microns (235–185) but does not affect thermal post 22 at its peripheral portion adjacent to adhesive 28 outside cavity 68 or its bottom portion adjacent to base 26 beneath cavity 68.

FIG. 4L is a cross-sectional view of the structure after etch mask 64 and cover mask 66 are removed. Photoresist layers 64 and 66 can be stripped in the same manner as photoresist layers 16 and 18.

Cavity 68 extends through cap 58 into thermal post 22, is spaced from base 26 and adhesive 28 and faces in the upward direction. In other words, cavity 68 is covered by thermal post 22 in the downward direction but not the upward direction. Cavity 68 is also centrally located within the peripheries of and laterally surrounded by thermal post 22 and cap 58. Thus, cavity 68 is defined by thermal post 22 and cap 58.

Cavity 68 has a depth of 200 microns (through cap 58 into thermal post 22), a length and width at its square entrance (at the top surface of cap 58) of 1400 microns and a length and width at its square bottom (within thermal post 22) of 1200 microns. Thus, cavity 68 is spaced from base 26 by 50 microns. Furthermore, cavity 68 has a cut-off pyramidal shape (resembling a frustum) with tapered sidewalls in which its diameter increases as it extends upwardly from its bottom within thermal post 22 to its entrance at the top surface of cap 58. The tapered sidewalls arise from the lateral undercutting by the wet chemical etch beneath etch mask 64. Cavity 68 also has its bottom concentrically disposed within its entrance and extends across a majority of the height and diameter of thermal post 22.

Heat spreader 70 includes thermal post 22, base 26 and cap 58. Thermal post 22 and base 26 are integral with one another. Cap 58 is above and adjacent to and covers in the upward direction and extends laterally in the lateral directions from the top of thermal post 22. Cap 58 is positioned so that thermal post 22 and cavity 68 are centrally located within its periphery. Cap 58 also contacts the underlying portion of adhesive 28 that is coplanar with and adjacent to and laterally surrounds thermal post 22 and covers this portion in the upward direction.

Heat spreader 70 is essentially a heat slug with an I-like shape that includes a pedestal (thermal post 22), lower wings (base 26 portions that extend laterally from the pedestal) and upper wings (cap 58 portions that extend laterally from the pedestal).

FIG. 4M is a cross-sectional view of the structure with plated contacts 72 formed on thermal post 22, base 26, pad 56, cap 58 and terminal 60.

Plated contacts 72 are thin spot plated metal coatings that contact thermal post 22, pad 56 and cap 58 and cover their exposed portions in the upward direction and contact base 26 and terminal 60 and cover their exposed portions in the downward direction. For instance, a nickel layer is electrolessly plated on thermal post 22, base 26, pad 56, cap 58 and terminal 60, and then a silver layer is electrolessly plated on the nickel layer. The buried nickel layer has a thickness of 3 microns, the silver surface layer has a thickness of 0.5 microns, and plated contacts 72 have a thickness of 3.5 microns.

Thermal post 22, base 26, pad 56, cap 58 and terminal 60 treated with plated contacts 72 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 72 also protect thermal post 22, base 26, pad 56, cap 58 and terminal 60 from corrosion. Plated contacts 72 can include a wide variety of metals to accommodate the external connection media. For instance, a gold surface layer can be plated on a buried nickel layer.

Thermal post 22, base 26, pad 56, cap 58 and terminal 60 treated with plated contacts 72 are shown as single layers for convenience of illustration. The boundary (not shown) with plated contacts 72 in thermal post 22, base 26, pad 56, cap 58 and terminal 60 occurs at the copper/nickel interface.

At this stage, the manufacture of thermal board 80 can be considered complete.

FIGS. 4N, 4O and 4P are cross-sectional, top and bottom views, respectively, of thermal board 80 after it is detached at peripheral edges along cut lines from a support frame and/or adjacent thermal boards in a batch.

Thermal board 80 includes adhesive 28, substrate 34, conductive trace 62 and heat spreader 70. Substrate 34 includes dielectric layer 38. Conductive trace 62 includes signal post 24, pad 56 and terminal 60. Heat spreader 70 includes thermal post 22, base 26 and cap 58. Cavity 68 extends into thermal post 22.

Thermal post 22 extends through opening 30 and into aperture 40, extends above dielectric layer 38, remains centrally located within opening 30 and aperture 40 and is coplanar at its top with an adjacent portion of adhesive 28 above dielectric layer 38 and at its bottom with an adjacent portion of adhesive 28 that contacts base 26. Thermal post 22 retains its cut-off conical shape with tapered sidewalls in which its diameter decreases as it extends upwardly from base 26 to its flat circular top adjacent to cap 58.

Signal post 24 extends through opening 32 and into aperture 42, extends above dielectric layer 38, remains centrally located within opening 32 and aperture 42 and is coplanar at its top with an adjacent portion of adhesive 28 above dielectric layer 38 and at its bottom with an adjacent portion of adhesive 28 that contacts terminal 60. Signal post 24 retains its cut-off conical shape with tapered sidewalls in which its diameter decreases as it extends upwardly from terminal 60 to its flat circular top adjacent to pad 56.

Base 26 covers thermal post 22 in the downward direction and is spaced from the peripheral edges of thermal board 80.

Cap 58 is above and adjacent to and thermally connected to thermal post 22, covers the top of thermal post 22 in the upward direction and laterally extends from the top of thermal post 22 in the lateral directions. Cap 58 also contacts and covers in the upward direction a portion of adhesive 28 that is coplanar with and adjacent to and laterally surrounds thermal post 22. Cap 58 is also coplanar with pad 56 above dielectric layer 38.

Cavity 68 remains centrally located within and exposed by thermal post 22 and cap 58.

Adhesive 28 is mounted on and extends above base 26 and terminal 60, contacts and is sandwiched between and fills the space between thermal post 22 and dielectric layer 38 in gap 44, contacts and is sandwiched between and fills the space between signal post 24 and dielectric layer 38 in gap 46, contacts and is sandwiched between and fills the space between base 26 and dielectric layer 38 in outside gaps 44 and 46, and contacts and is sandwiched between and fills the space between terminal 60 and dielectric layer 38 outside gaps 44 and 46. Adhesive 28 also extends laterally from thermal post 22 beyond and overlaps terminal 60, covers base 26 outside the periphery of thermal post 22 in the upward direction, covers terminal 60 outside the periphery of signal post 24 in the upward direction, covers substrate 34 in the downward direction, covers and surrounds thermal post 22 and signal post 24 in the lateral directions, fills most of the space between substrate 34 and heat spreader 70 and is solidified.

Substrate 34 is mounted on and contacts adhesive 28, extends above the underlying adhesive 28 and extends above base 26, conductive layer 36 (as well as pad 56 and cap 58) contacts and extends above dielectric layer 38, and dielectric layer 38 contacts and is sandwiched between adhesive 28 and conductive layer 36.

Thermal post 22 and signal post 24 have the same thickness and are coplanar with one another, and base 26 and terminal 60 have the same thickness and are coplanar with one another. Furthermore, posts 22 and 24 are coplanar with adhesive 28 at their tops and bottoms.

Thermal post 22, base 26 and cap 58 remain spaced from signal post 24, pad 56 and terminal 60. As a result, conductive trace 62 and heat spreader 70 are mechanically attached and electrically isolated from one another.

Adhesive 32 and dielectric layer 38 extend to straight vertical peripheral edges of thermal board 80 after it is detached or singulated from a batch of identical simultaneously manufactured thermal boards.

Pad 56 is customized as an electrical interface for a semiconductor device such as an LED chip that is subsequently mounted on thermal post 22 in cavity 68, and terminal 60 is customized as an electrical interface for the next level assembly such as a solderable wire from a printed circuit board, and base 26 is customized as a thermal interface for the next level assembly such as the printed circuit board or a heat sink for an electronic device.

Pad 56 and terminal 60 are vertically offset from one another and exposed at the top and bottom surfaces, respectively, of thermal board 80, thereby providing vertical routing between the semiconductor device and the next level assembly.

Pad 56 and cap 58 are coplanar with one another at their top surfaces above dielectric layer 38, and base 26 and terminal 60 are coplanar with one another at their bottom surfaces below adhesive 28.

Conductive trace 62 is shown in cross-section as a continuous circuit trace for convenience of illustration. However, conductive trace 62 typically provides horizontal signal routing in both the X and Y directions. That is, pad 56 and terminal 60 are laterally offset from one another in the X and Y directions.

Heat spreader 70 provides heat spreading and heat dissipation from a semiconductor device that is subsequently mounted on cap 58 to the next level assembly that thermal board 80 is subsequently mounted on. The semiconductor device generates heat that flows into cap 58, from cap 58 into thermal post 22 and through thermal post 22 into base 26 where it is spread out and dissipated in the downward direction, for instance to an underlying heat sink.

Plated contacts 72 occupy 85 to 95 percent of the top surface of thermal board 80 and thus provide a highly reflective top surface which is particularly useful if an LED device is subsequently mounted on thermal post 22 in cavity 68.

Thermal board 80 does not expose signal post 24 which is covered by pad 56 and terminal 60 in the upward and downward directions, respectively. Signal post 24 is shown in phantom in FIG. 4O for convenience of illustration.

Thermal board 80 includes other conductive traces 62 that typically include signal post 24, pad 56 and terminal 60. A single conductive trace 62 is described and labeled for convenience of illustration. In conductive traces 62, signal posts 24, pads 56 and terminals 60 generally have similar shapes and sizes. For instance, some conductive traces 62 may be spaced and separated and electrically isolated from one another whereas other conductive traces 62 can intersect or route to the same pad 56 or terminal 60 and be electrically connected to one another. Likewise, some pads 56 may receive independent signals whereas other pads 56 share a common signal, power or ground.

Thermal board 80 can be adapted for an LED package with blue, green and red LED chips, with each LED chip including an anode and a cathode and each LED package including a corresponding anode terminal and cathode terminal. In this instance, thermal board 80 can include six pads 56 and four terminals 60 so that each anode is routed from a separate pad 56 to a separate terminal 60 whereas each cathode is routed from a separate pad 56 to a common ground terminal 60.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 62 after they are formed. A plating bus can be disconnected during the wet chemical etch that forms pad 56 and cap 58.

Thermal board 80 can include registration holes (not shown) that are drilled or sliced through adhesive 28 and substrate 34 so that thermal board 80 can be positioned by inserting tooling pins through the registration holes when it is subsequently mounted on an underlying carrier.

Thermal board 80 can also include a top solder mask that selectively exposes pad 56 and cap 58 as well as a bottom solder mask that selectively exposes base 26 and terminal 60.

Thermal board 80 can omit cap 58. This can be accomplished by adjusting etch mask 52 to expose conductive layer 50 above all of aperture 40 to the wet chemical etch that forms pad 56. This can also be accomplished by omitting conductive layer 50.

Thermal board 80 can accommodate multiple semiconductor devices rather than one. This can be accomplished by adjusting etch mask 16 to define additional thermal posts 22 and signal posts 24, adjusting adhesive 28 to include additional openings 30 and 32, adjusting substrate 34 to include additional apertures 40 and 42, adjusting etch mask 52 to define additional pads 56 and caps 60, adjusting etch mask 54 to define additional terminals 60 and adjusting etch mask 64 to define additional cavities 68. These elements can be laterally repositioned to provide a 2×2 array for four semiconductor devices. In addition, the topography (lateral shape) can be adjusted for some but not all of the elements.

Figure 5A:
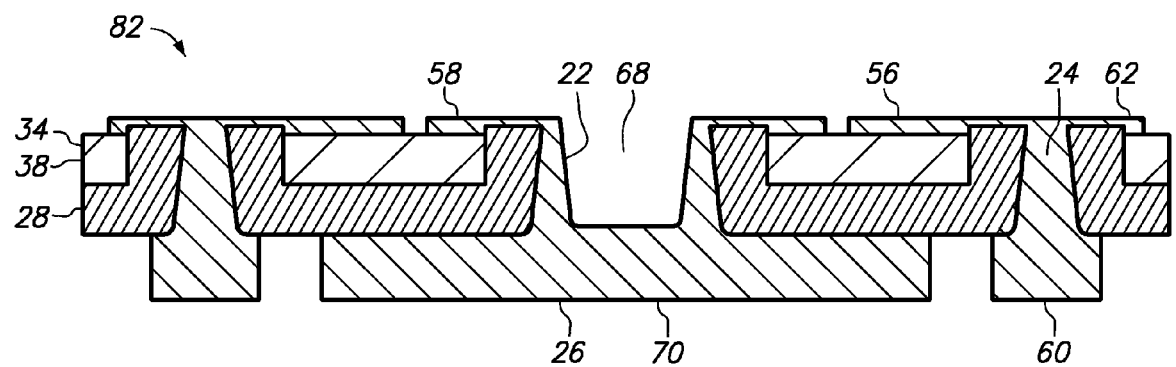
FIGS. 5A, 5B and 5C are cross-sectional, top and bottom views, respectively, of a thermal board with substrate on an adhesive in accordance with an embodiment of the present invention.
Figure 5B:
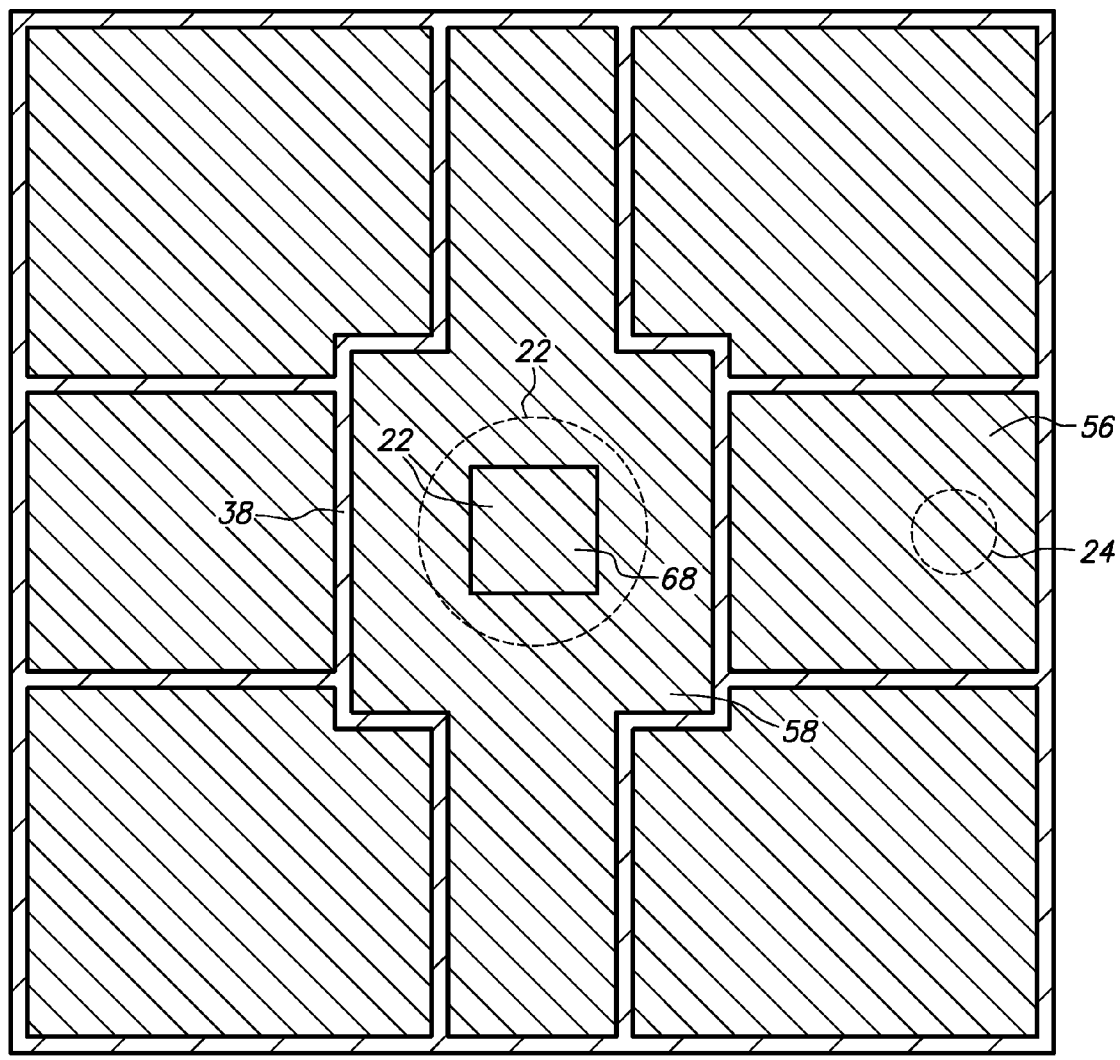
Figure 5C:
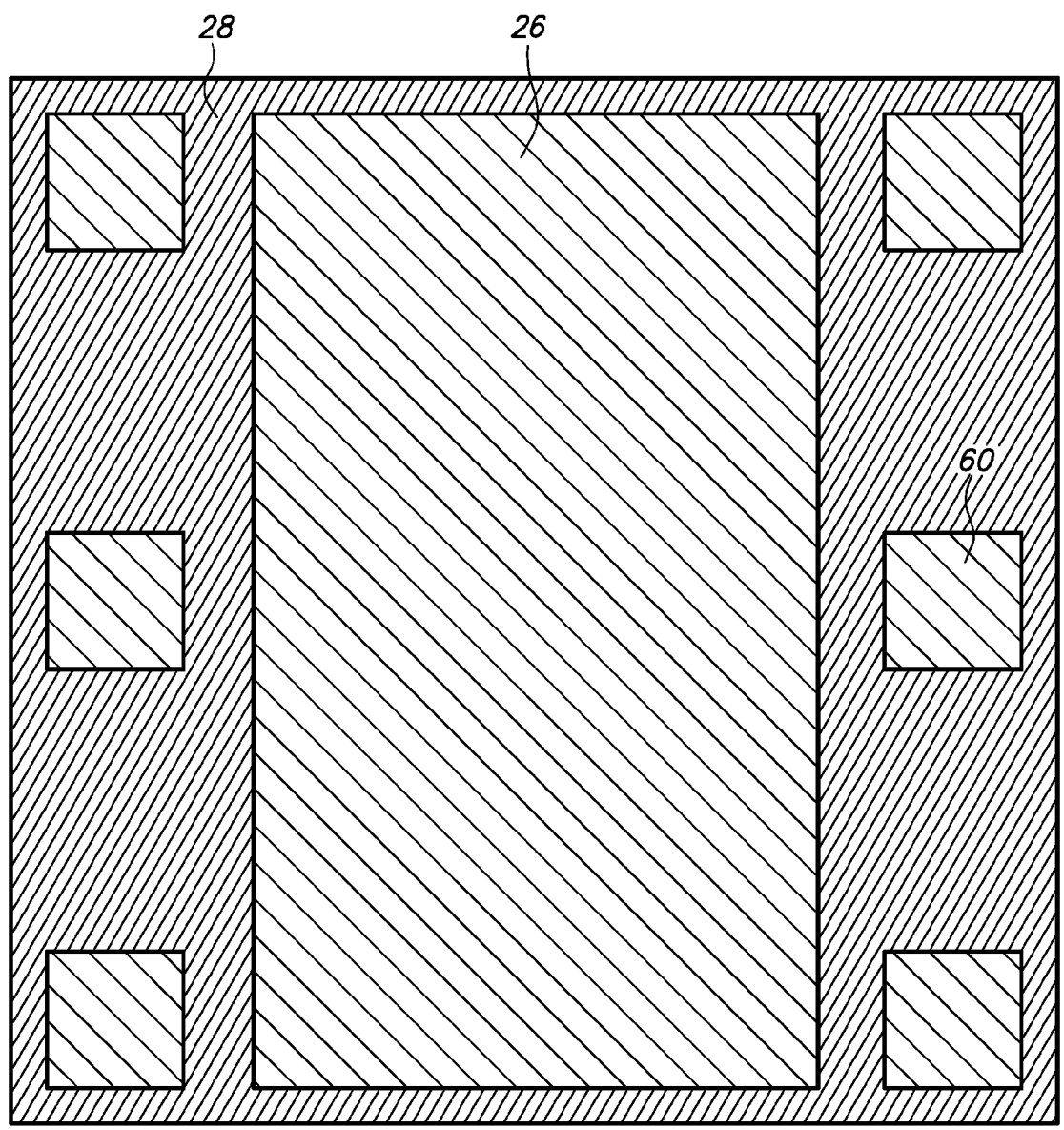

FIGS. 5A, 5B and 5C are cross-sectional, top and bottom views, respectively, of a thermal board with a cavity formed before solidifying the adhesive in accordance with an embodiment of the present invention.

In this embodiment, the thermal post and the cavity are formed simultaneously by etching the metal plate using an etch mask to define the thermal post and the cavity. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 82 includes adhesive 28, substrate 34, conductive trace 62 and heat spreader 70. Substrate 34 includes dielectric layer 38. Conductive trace 62 includes signal post 24, pad 56 and terminal 60. Heat spreader 70 includes thermal post 22, base 26 and cap 58. Cavity 68 extends into thermal post 22.

Cavity 68 is deeper in this embodiment than the previous embodiment. For instance, cavity 68 is spaced from base 26 by about 20 microns (rather than 50 microns).

Thermal board 82 can be manufactured in a manner similar to thermal board 80 with suitable adjustments for cavity 68. For instance, etch mask 16 defines thermal post 22, signal post 24 and cavity 68 and thus selectively exposes (rather than cover) thermal post 22. Thereafter, metal plate 10 is etched in the pattern defined by etch mask 16 to simultaneously form thermal post 22, signal post 24 and cavity 68, and then etch mask 16 and cover mask 18 are removed. As a result, cavity 68 has a depth of 250 microns which is the height of posts 22 and 24. Thereafter, adhesive 28 is mounted on base 26, substrate 34 is mounted on adhesive 28, heat and pressure are applied to flow and solidify adhesive 28, grinding is applied to planarize the top surface and then conductive layer 50 is deposited on the structure as previously described. Thereafter, conductive layers 36 and 50 are etched to form pad 56 and cap 58 and base 26 is etched to form terminal 60. Etch mask 64, cover mask 66 and the related etch step are omitted since cavity 68 has been formed. Thereafter, plated contacts 72 provide a surface finish for thermal post 22, base 26, pad 56, cap 58 and terminal 60.

Figure 6A:
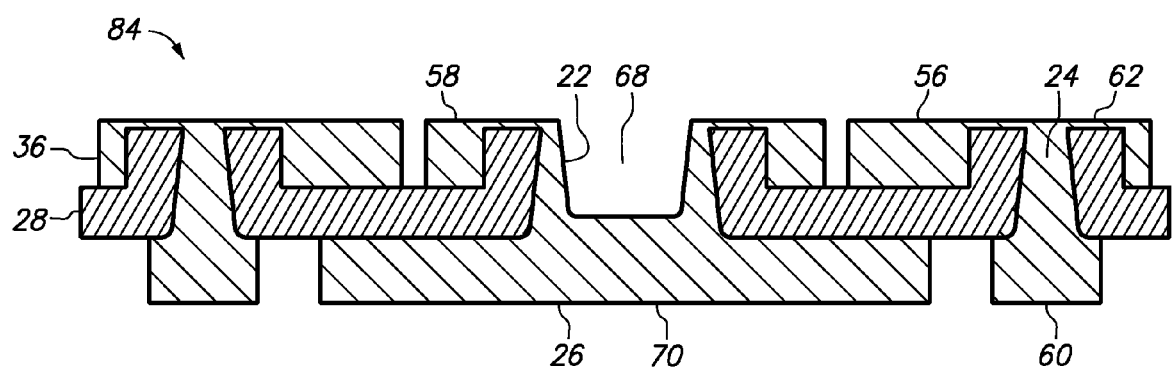
FIGS. 6A, 6B and 6C are cross-sectional, top and bottom views, respectively, of a thermal board with a conductive trace on an adhesive in accordance with an embodiment of the present invention.
Figure 6B:
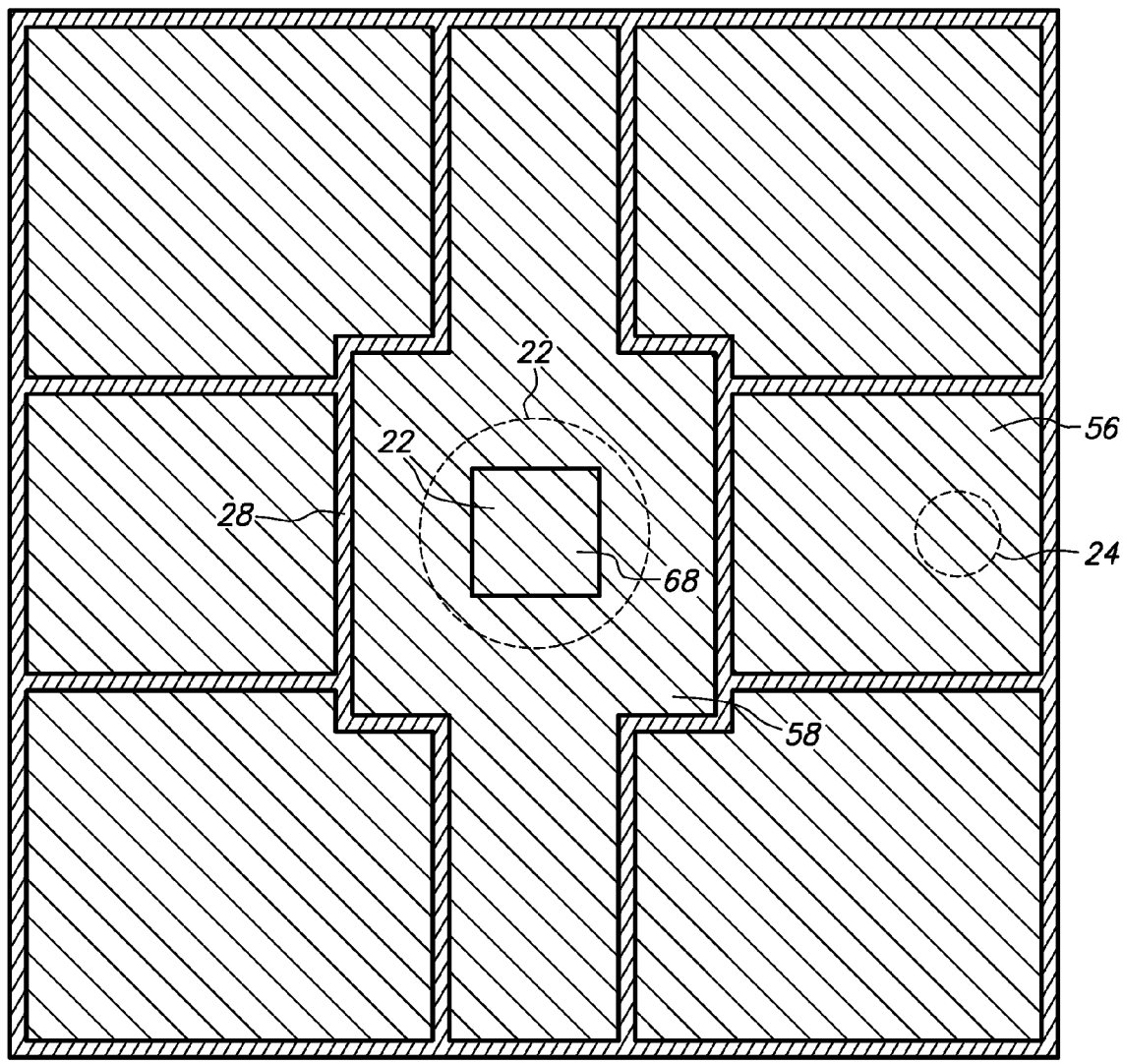
Figure 6C:
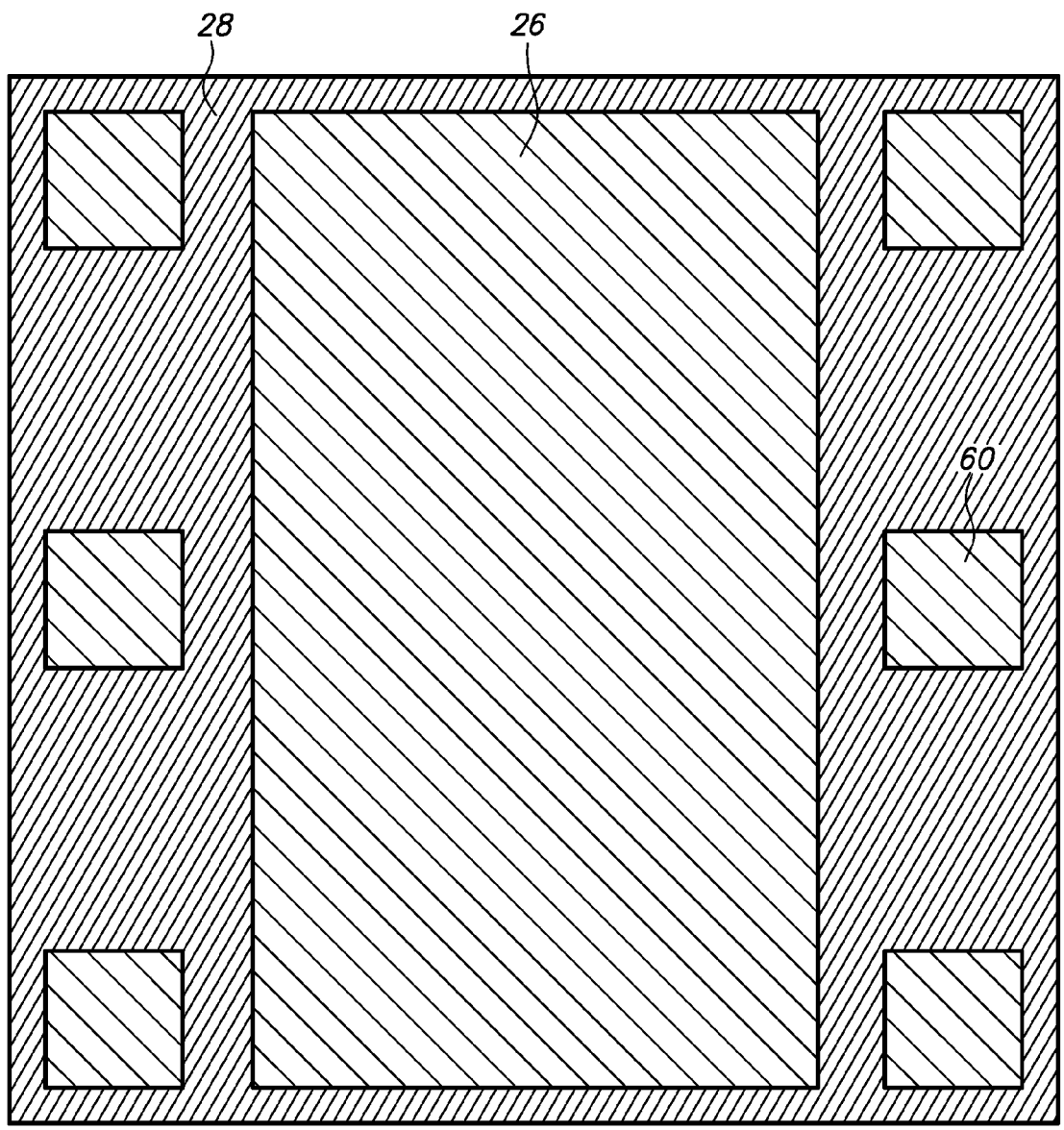

FIGS. 6A, 6B and 6C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 84 includes adhesive 28, conductive trace 62 and heat spreader 70. Conductive trace 62 includes signal post 24, pad 56 and terminal 60. Heat spreader 70 includes thermal post 22, base 26 and cap 58. Cavity 68 extends into thermal post 22.

Conductive layer 36 is thicker in this embodiment than the previous embodiment. For instance, conductive layer 36 has a thickness of 130 microns (rather than 30 microns) so that it can be handled without warping or wobbling. Pad 56 is therefore thicker, and thermal board 84 is devoid of a dielectric layer corresponding to dielectric layer 38.

Thermal board 84 can be manufactured in a manner similar to thermal board 80 with suitable adjustments for thermal post 22, signal post 24 and conductive layer 36. For instance, metal plate 10 has a thickness of 370 microns (rather than 400 microns) so that posts 22 and 24 have a height of 220 microns (rather than 250 microns). This can be accomplished by reducing the etch time. Thereafter, adhesive 28 is mounted on base 26, conductive layer 36 alone is mounted on adhesive 28, heat and pressure are applied to flow and solidify adhesive 28, grinding is applied to planarize the top surface and then conductive layer 50 is deposited on the structure as previously described. Thereafter, conductive layers 36 and 50 are etched to form pad 56 and cap 58 and base 26 is etched to form terminal 60. Thereafter, thermal post 22 and cap 58 are etched to form cavity 68 and then plated contacts 72 provide a surface finish for thermal post 22, base 26, pad 56, cap 58 and terminal 60.

Figure 7A:
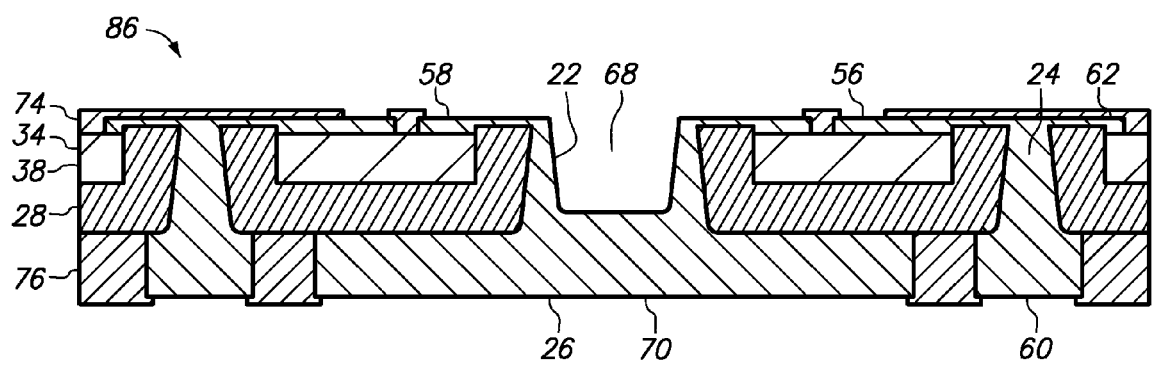
FIGS. 7A, 7B and 7C are cross-sectional, top and bottom views, respectively, of a thermal board with solder masks in accordance with an embodiment of the present invention.
Figure 7B:
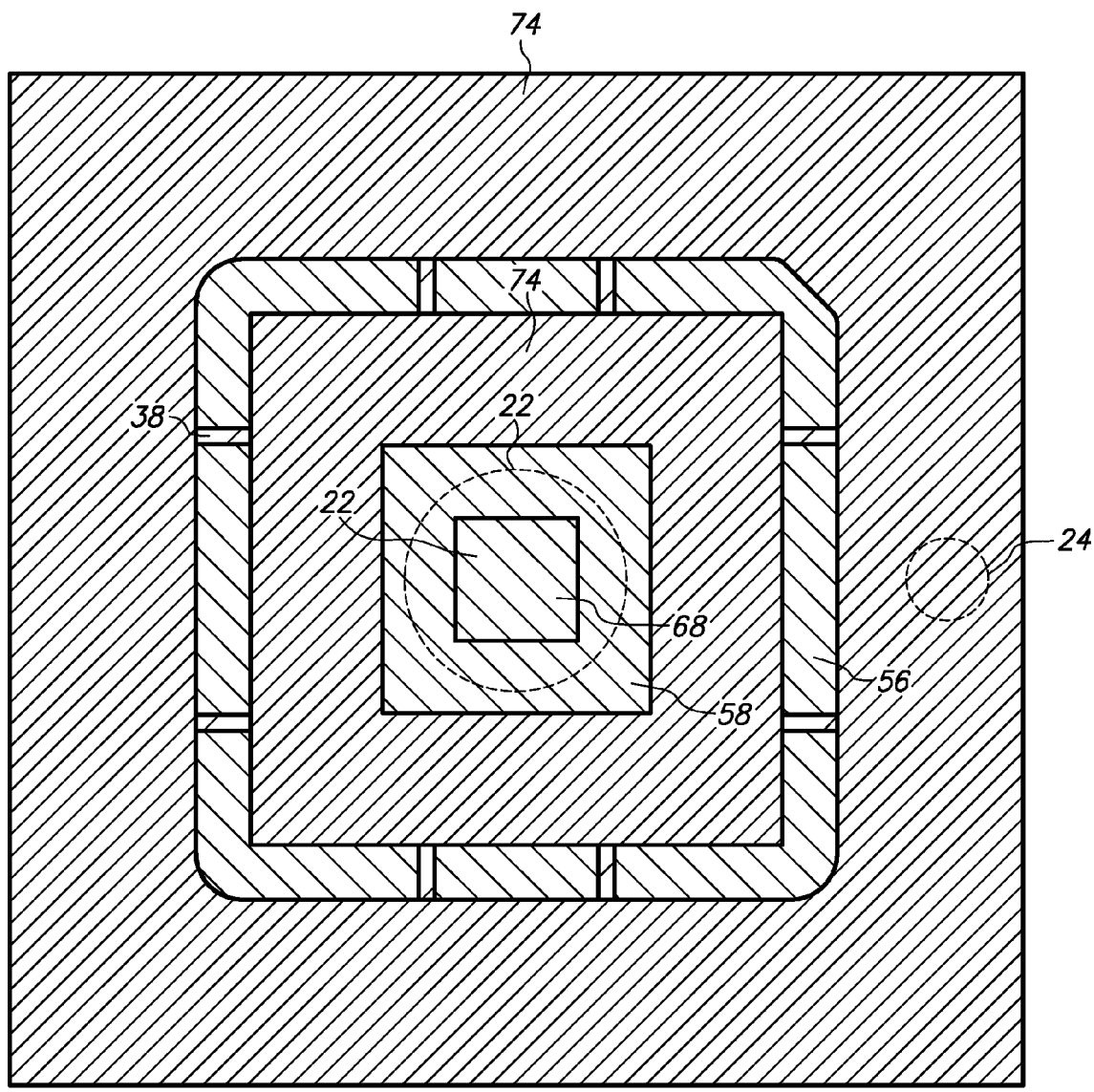
Figure 7C:
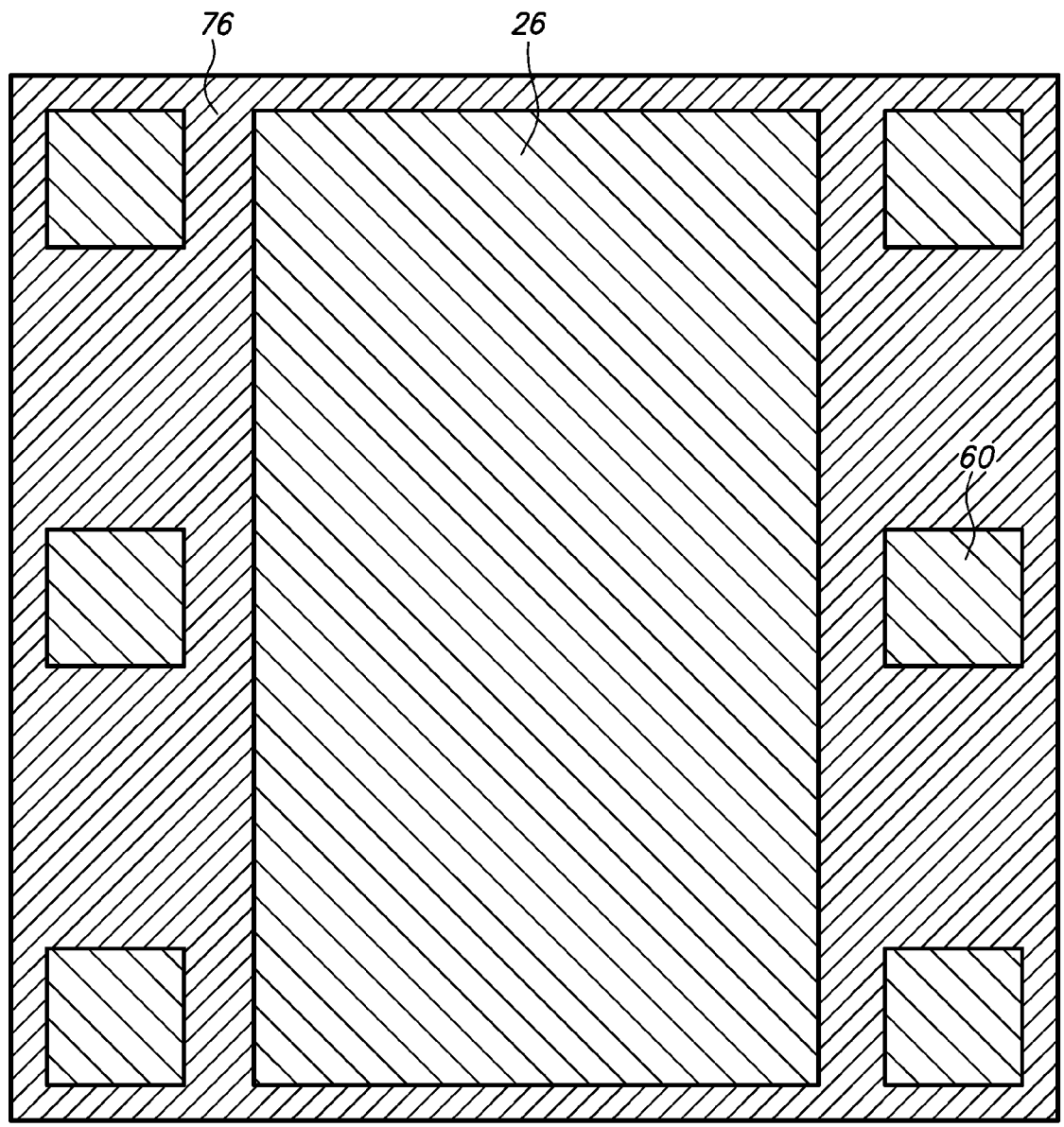

FIGS. 7A, 7B and 7C are cross-sectional, top and bottom views, respectively, of a thermal board with solder masks in accordance with an embodiment of the present invention.

In this embodiment, top and bottom solder masks selectively expose the conductive trace and the heat spreader. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 86 includes adhesive 28, substrate 34, conductive trace 62, heat spreader 70 and solder masks 74 and 76. Substrate 34 includes dielectric layer 38. Conductive trace 62 includes signal post 24, pad 56 and terminal 60. Heat spreader 70 includes thermal post 22, base 26 and cap 58. Cavity 68 extends into thermal post 22.

Solder mask 74 is an electrically insulative layer that selectively exposes thermal post 22, pad 56, cap 58 and cavity 68 in the upward direction. Solder mask 74 has a thickness of 25 microns above pad 56 and cap 58 and extends 55 microns (30+25) above dielectric layer 38.

Solder mask 76 is an electrically insulative layer that selectively exposes base 26 and terminal 60 in the downward direction. Solder mask 76 is coplanar with base 26 and terminal 60 at a smoothed lapped lateral bottom surface that is below adhesive 28 and faces in the downward direction.

Thermal board 86 can be manufactured in a manner similar to thermal board 80 with suitable adjustments for solder masks 74 and 76. For instance, adhesive 28 is mounted on base 26, substrate 34 is mounted on adhesive 28, heat and pressure are applied to flow and solidify adhesive 28, grinding is applied to planarize the top surface and then conductive layer 50 is deposited on the structure as previously described. Thereafter, conductive layers 36 and 50 are etched to form pad 56 and cap 58, base 26 is etched to form terminal 60 and then thermal post 22 and cap 58 are etched to form cavity 68. Thereafter, solder mask 74 is formed on the top surface and solder mask 76 is formed on the bottom surface.

Solder mask 74 is initially a photoimageable liquid resin that is dispensed on the top surface. Thereafter, solder mask 74 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

Solder mask 76 is initially a liquid resin that is dispensed on the bottom surface. Thereafter, base 26, terminal 60 and solder mask 76 have their lower portions removed by grinding. For instance, a rotating diamond sand wheel and distilled water are applied to the bottom of the structure. Initially, the diamond sand wheel grinds only solder mask 76. As the grinding continues, solder mask 76 becomes thinner as its grinded surface migrates upwardly. Eventually the diamond sand wheel contacts base 26 and terminal 60 (not necessarily at the same time), and as a result, begins to grind base 26 and terminal 60 as well. As the grinding continues, base 26, terminal 60 and solder mask 76 become thinner as their grinded surfaces migrate upwardly. The grinding continues until base 26 and terminal 60 are fully exposed in the downward direction. Thereafter, the structure is rinsed in distilled water to remove contaminants.

The grinding removes a 25 micron lower portion of solder mask 76, a 15 micron thick lower portion of base 26 and a 15 micron thick lower of terminal 60. The decreased thickness does not appreciably affect base 26 or terminal 60. However, solder mask 76 no longer covers base 26 or terminal 60 in the downward direction.

Thereafter, plated contacts 72 provide a surface finish for thermal post 22, base 26, pad 56, cap 58 and terminal 60

Figure 8A:
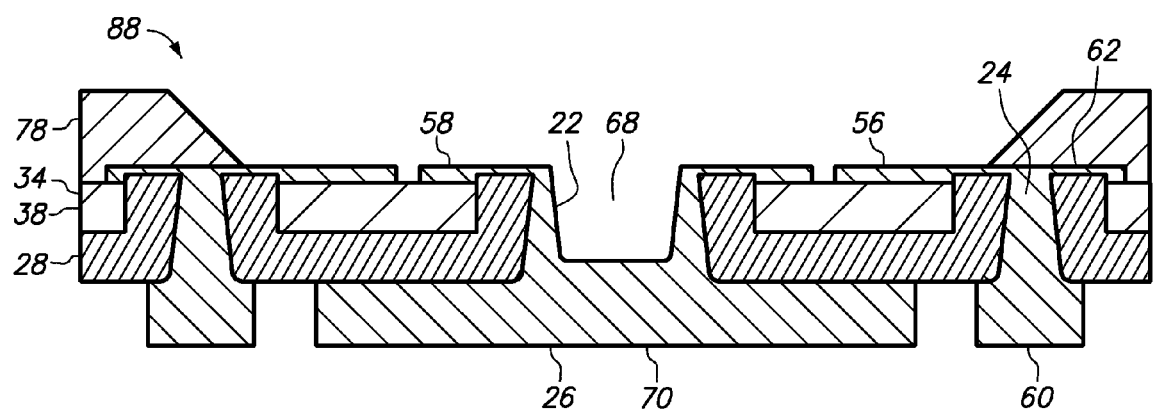
FIGS. 8A, 8B and 8C are cross-sectional, top and bottom views, respectively, of a thermal board with a rim accordance with an embodiment of the present invention.
Figure 8B:
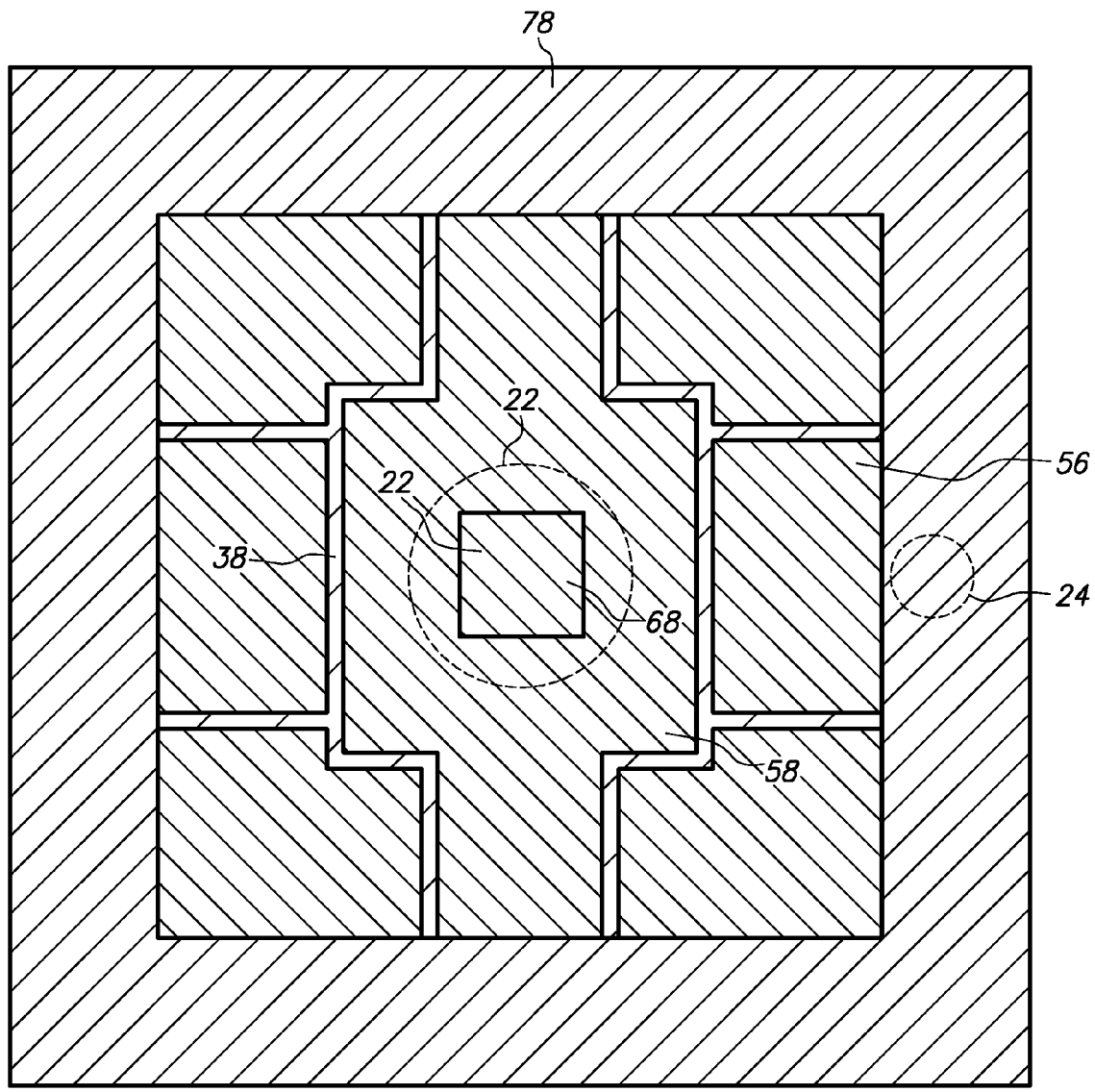
Figure 8C:
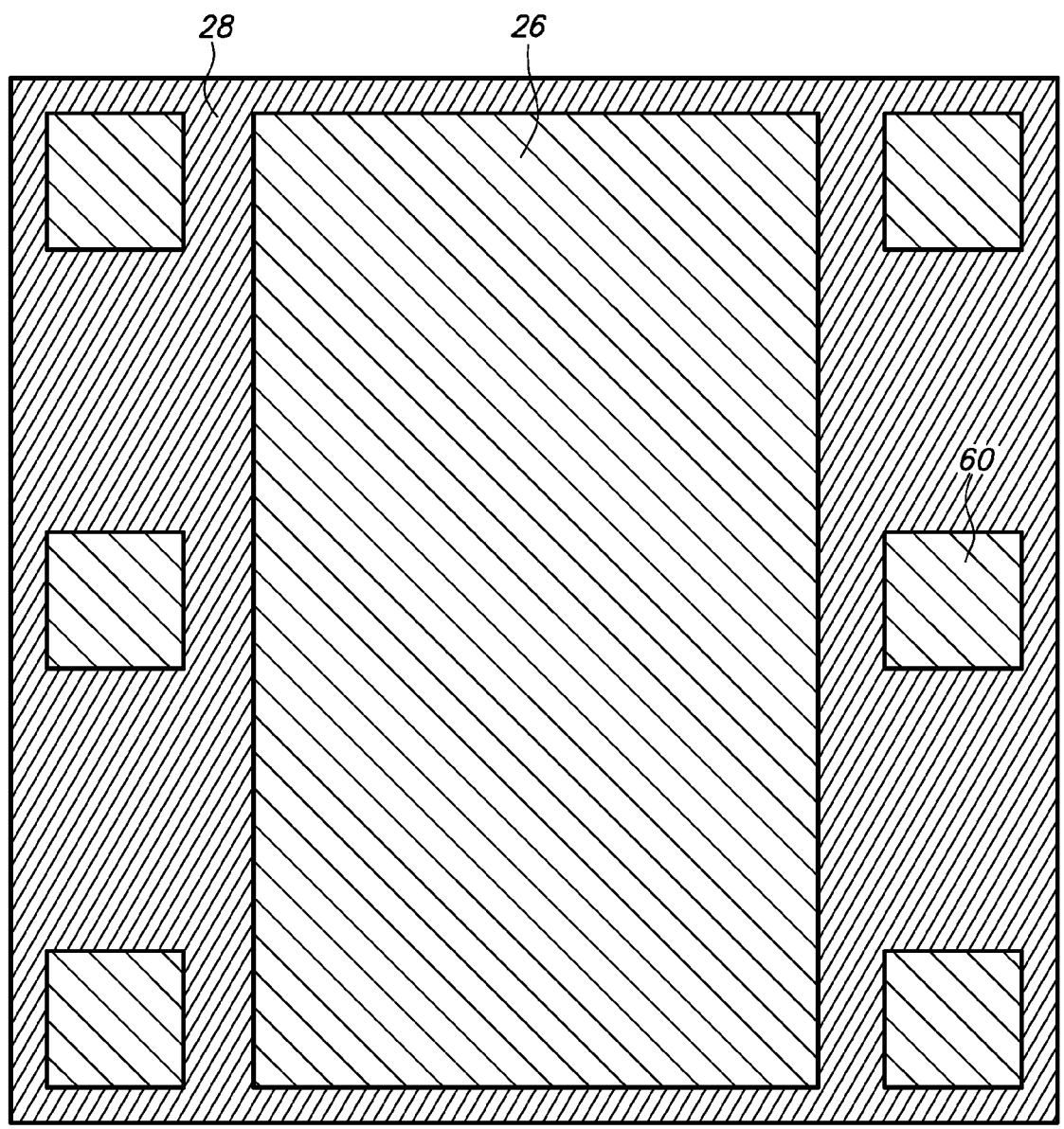

FIGS. 8A, 8B and 8C are cross-sectional, top and bottom views, respectively, of a thermal board with a rim in accordance with an embodiment of the present invention.

In this embodiment, a rim is mounted on the top surface. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 88 includes adhesive 28, substrate 34, conductive trace 62, heat spreader 70 and rim 78. Substrate 34 includes dielectric layer 38. Conductive trace 62 includes signal post 24, pad 56 and terminal 60. Heat spreader 70 includes thermal post 22, base 26 and cap 58. Cavity 68 extends into thermal post 22.

Rim 78 is a square shaped frame that contacts and extends above pad 56. Thermal post 22, cap 58 and cavity 68 are centrally located within the periphery of rim 78. For instance, rim 78 has a height of 600 microns, a width (between its inner and outer circular sidewalls) of 1000 microns and is laterally spaced from cavity 68 by 500 microns.

Rim 78 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 78 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 78 can include a metal ring on the adhesive film.

Thermal board 88 can be manufactured in a manner similar to thermal board 80 with suitable adjustments for rim 78. For instance, adhesive 28 is mounted on base 26, substrate 34 is mounted on adhesive 28, heat and pressure are applied to flow and solidify adhesive 28, grinding is applied to planarize the top surface and then conductive layer 50 is deposited on the structure as previously described. Thereafter, conductive layers 36 and 50 are etched to form pad 56 and cap 58, base 26 is etched to form terminal 60 and then thermal post 22 and cap 58 are etched to form cavity 68. Thereafter, rim 78 is mounted on the top surface and then plated contacts 72 provide a surface finish for thermal post 22, base 26, pad 56, cap 58 and terminal 60.

Figure 9A:
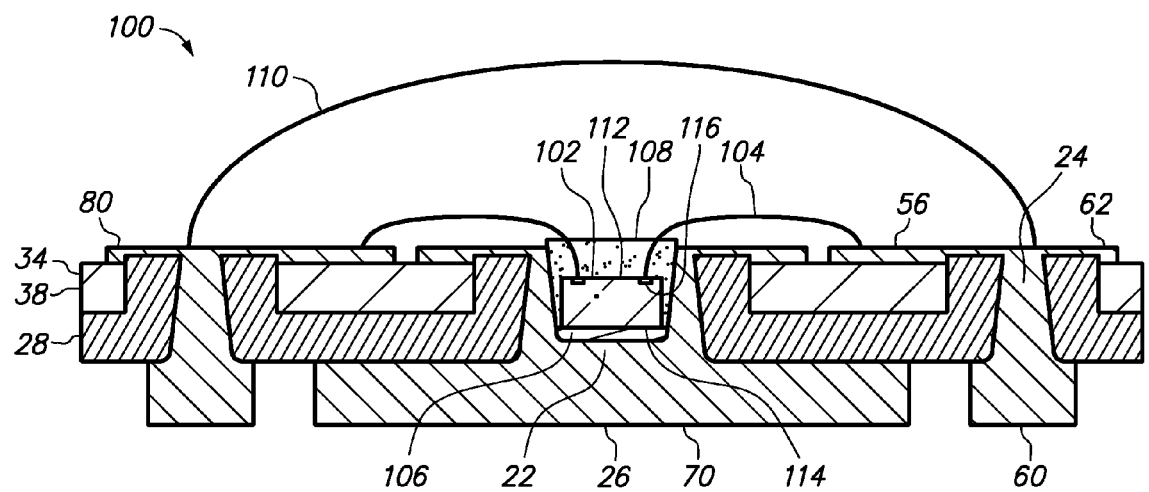
FIGS. 9A, 9B and 9C are cross-sectional, top and bottom views, respectively, of a semiconductor chip assembly that includes a thermal board, a semiconductor device and dual encapsulants in accordance with an embodiment of the present invention.
Figure 9B:
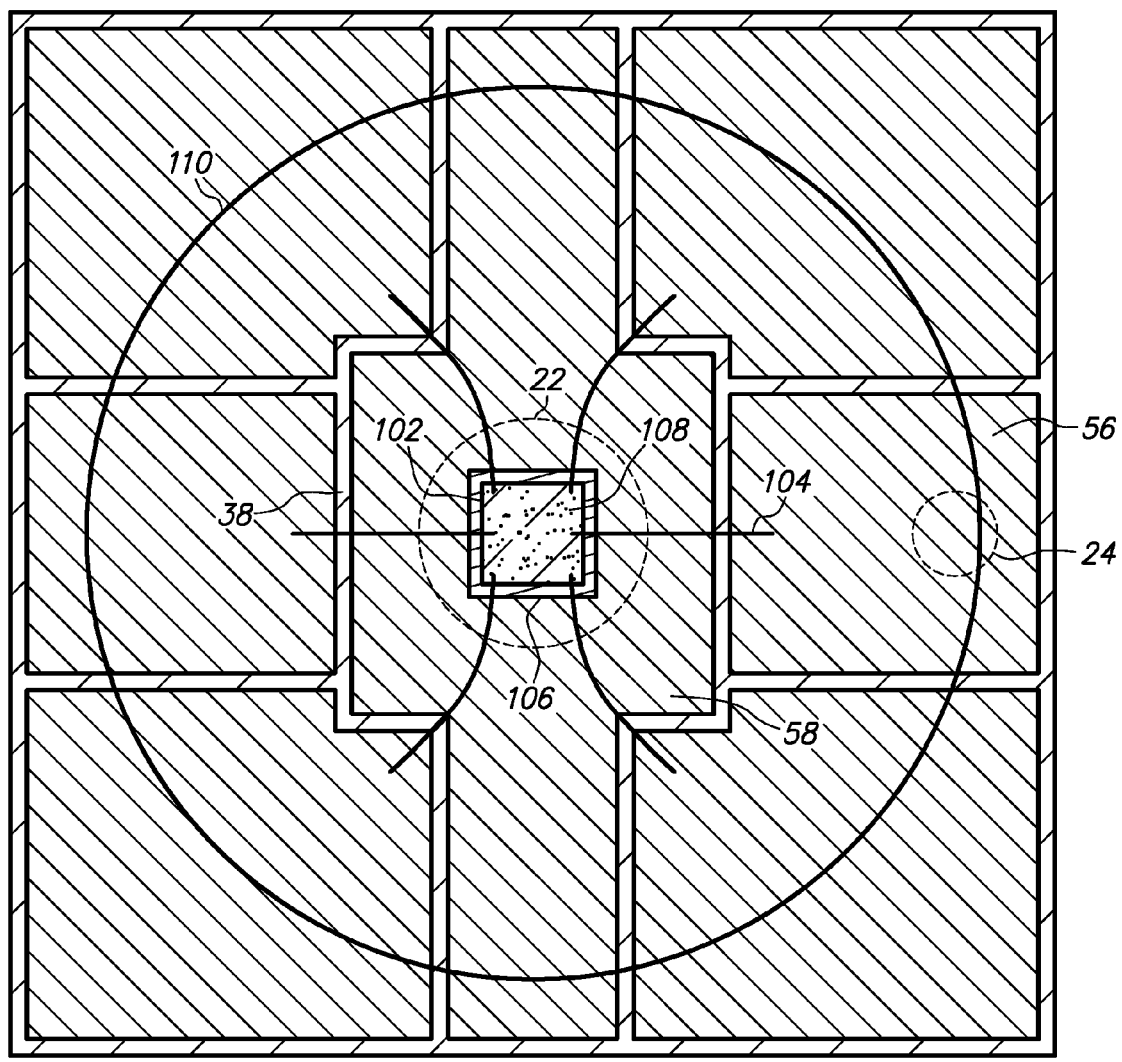
Figure 9C:
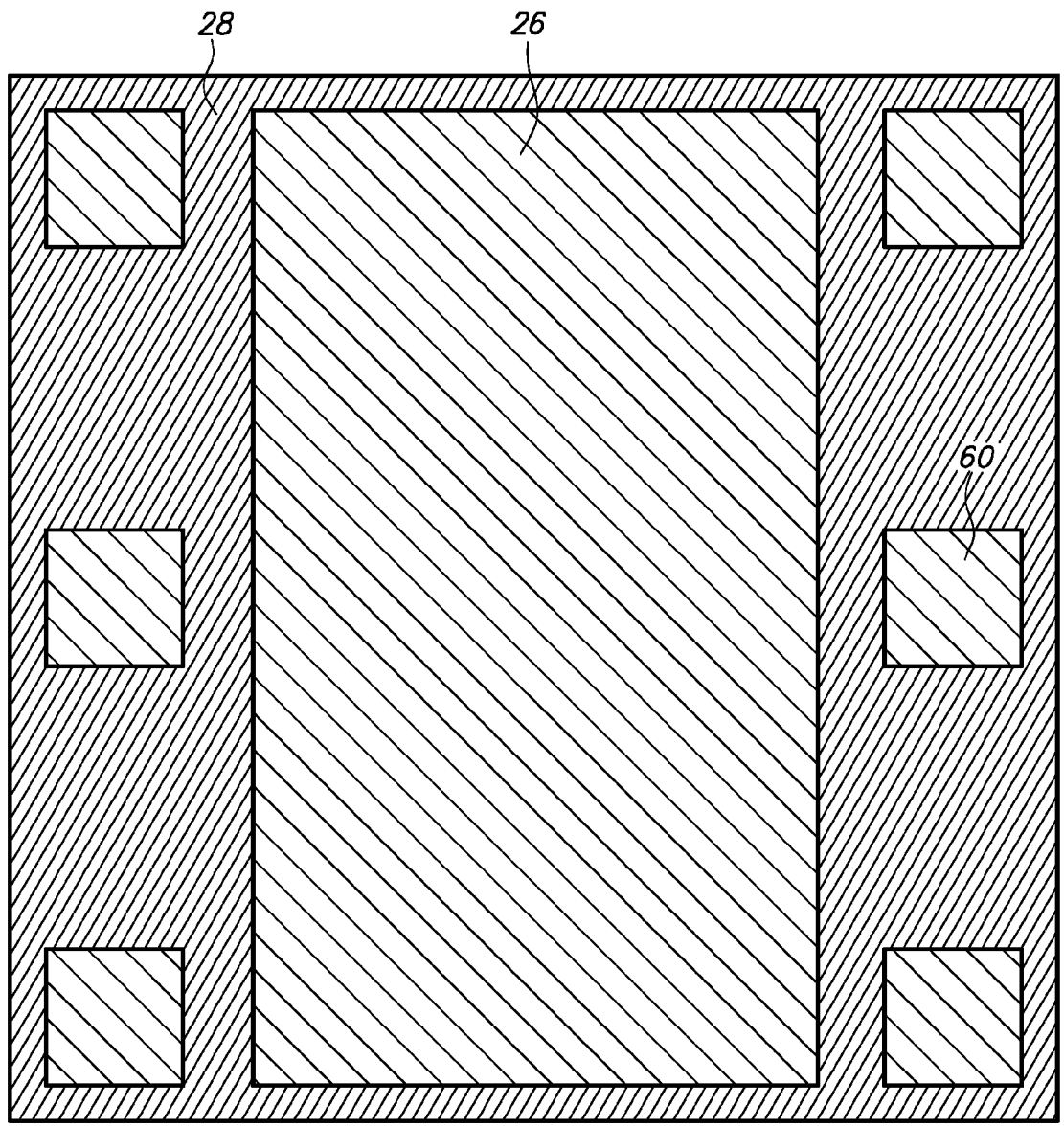

FIGS. 9A, 9B and 9C are cross-sectional, top and bottom views, respectively, of a semiconductor chip assembly that includes a thermal board, a semiconductor device and dual encapsulants in accordance with an embodiment of the present invention.

In this embodiment, the semiconductor device is an LED chip that emits blue light, is mounted on the thermal post in the cavity, is electrically connected to the pad using a wire bond and is thermally connected to the thermal post using a die attach. The semiconductor device is covered by a color-shifting encapsulant that converts the blue light to white light, and the color-shifting encapsulant is covered by a transparent encapsulant that emits the white light.

Semiconductor chip assembly 100 includes thermal board 80, LED chip 102, wire bond 104, die attach 106 and encapsulants 108 and 110. LED chip 102 includes top surface 112, bottom surface 114 and bond pad 116. Top surface 112 is the active surface and includes bond pad 116 and bottom surface 114 is the thermal contact surface.

LED chip 102 is mounted on heat spreader 70, electrically connected to substrate 34 and thermally connected to heat spreader 70. In particular, LED chip 102 is mounted on thermal post 22, located within cavity 68 in thermal post 22 below cap 58, overlaps thermal post 22 but does not overlap substrate 34 or conductive trace 62, is laterally surrounded by thermal post 22 and adhesive 28, is electrically connected to conductive trace 62 by wire bond 104 and is thermally connected to and mechanically attached to thermal post 22 by die attach 106.

For instance, LED chip 102 has a thickness of 150 microns and die attach 106 has a thickness of 25 microns. As a result, the combined height of LED chip 102 (150 microns) and the underlying die attach 106 (25 microns) is 175 microns which is 25 microns less than the depth of cavity 68 (200 microns).

LED chip 102 has a length and width of 1000 microns and is centrally located within cavity 68 and spaced from thermal post 22.

LED chip 102 and die attach 106 are located within cavity 68, wire bond 104 and encapsulant 108 extend within and outside cavity 68, and substrate 34 and conductive trace 62 are located outside cavity 68. Wire bond 104 is bonded to and electrically connects pads 56 and 116, thereby electrically connecting LED chip 102 to terminal 60. Die attach 106 contacts and is sandwiched between and thermally connects and mechanically attaches thermal post 22 and thermal contact surface 114, thereby thermally connecting LED chip 102 to base 26.

Encapsulant 108 is a solid adherent electrically insulative color-shifting protective enclosure that provides environmental protection such as moisture resistance and particle protection for LED chip 102. Encapsulant 108 contacts thermal post 22, LED chip 102, wire bond 104 and die attach 106 in cavity 68, seals LED chip 102 within cavity 68, fills the remaining space in cavity 68 and covers cavity 68 and LED chip 102 in the upward direction. Encapsulant 108 extends above cavity 68 by 10 microns, is laterally confined by cavity 68, is almost entirely located within cavity 68 and is spaced from adhesive 26, substrate 34 and conductive trace 62.

Encapsulant 110 is a solid adherent electrically insulative transparent protective enclosure that provides environmental protection such as moisture resistance and particle protection for LED chip 102, wire bond 104 and encapsulant 108. Encapsulant 110 is located outside cavity 68, contacts adhesive 26, dielectric layer 38, pad 56, cap 58, conductive trace 62 and encapsulant 108 and covers LED chip 102, wire bond 104 and encapsulant 108 in the upward direction.

Pad 56 is spot plated with nickel/silver to bond well with wire bond 104, thereby improving signal transfer from substrate 34 to LED chip 102, and thermal post 22 is spot plated with nickel/silver to bond well with die attach 106, thereby improving heat transfer from LED chip 102 to heat spreader 70, and to provide a highly reflective surface which reflects the light emitted towards it by LED chip 102, thereby increasing light output in the upward direction.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor (shown as dots). For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light.

Encapsulant 110 includes transparent silicone but is devoid of fluorescent powder and does not color-shift the white light. Moreover, encapsulant 110 need not contain phosphor or fluorescent powder, and therefore using more encapsulant 110 than encapsulant 108 is still cost effective.

Encapsulant 108 converts the blue light emitted by LED chip 102 into white light, encapsulant 110 emits the white light emitted by encapsulant 108 and assembly 100 is a white light source. In addition, thermal post 22 has tapered sidewalls at cavity 68 that focus the blue light emitted by LED chip 102 in the upward direction, and encapsulant 110 has a hemisphere dome shape with a convex refractive surface that focuses the white light emitted by encapsulant 108 in the upward direction.

Semiconductor chip assembly 100 can be manufactured by mounting LED chip 102 on thermal post 22 using die attach 106, then wire bonding pads 56 and 116, then forming encapsulant 108 and then forming encapsulant 110.

For instance, die attach 106 is initially a silver-filled epoxy paste with high thermal conductivity that is deposited into cavity 68 on thermal post 22 by screen printing or dispensing by an injection nozzle in step-and-repeat fashion, and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 56 and 116. Thereafter, encapsulant 108 is deposited as an A-stage uncured epoxy into cavity 68 on LED chip 102 and wire bond 104 by screen printing or dispensing by an injection nozzle in step-and-repeat fashion. The liquid epoxy fills the remaining space in and extends slightly above and is laterally confined by cavity 68 which serves as a dam, and then the liquid epoxy is heated and hardened at a relatively low temperature such as 190° C., thereby converting the A-stage liquid uncured epoxy into C-stage cured or hardened epoxy. Thereafter, encapsulant 110 is molded on the structure.

LED chip 102 can be electrically connected to pad 56 by a wide variety of connection media, thermally connected to and mechanically attached to heat spreader 70 by a wide variety of thermal adhesives and encapsulated by a wide variety of encapsulants.

Semiconductor chip assembly 100 is a first-level single-chip package.

Figure 10A:
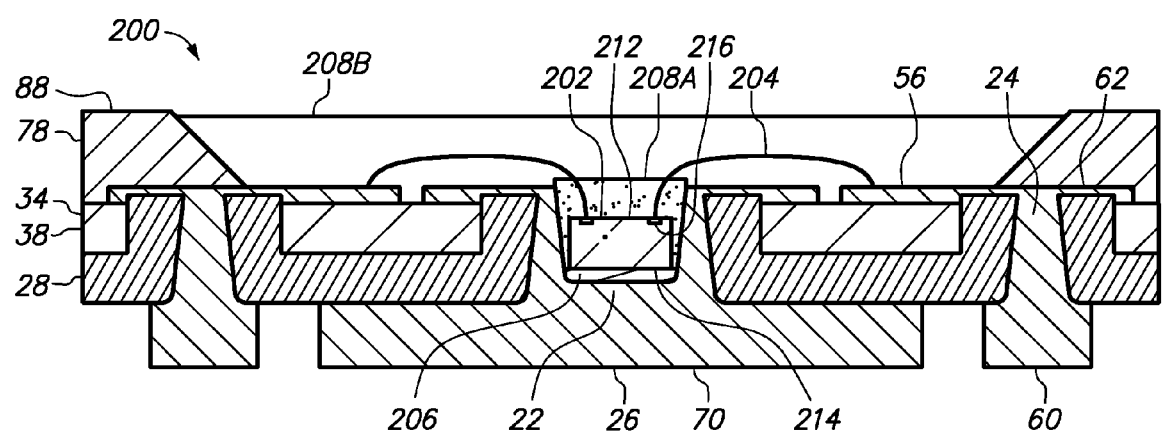
FIGS. 10A, 10B and 10C are cross-sectional, top and bottom views, respectively, of a semiconductor chip assembly that includes a thermal board with a rim, a semiconductor device and dual encapsulants in accordance with an embodiment of the present invention.
Figure 10B:
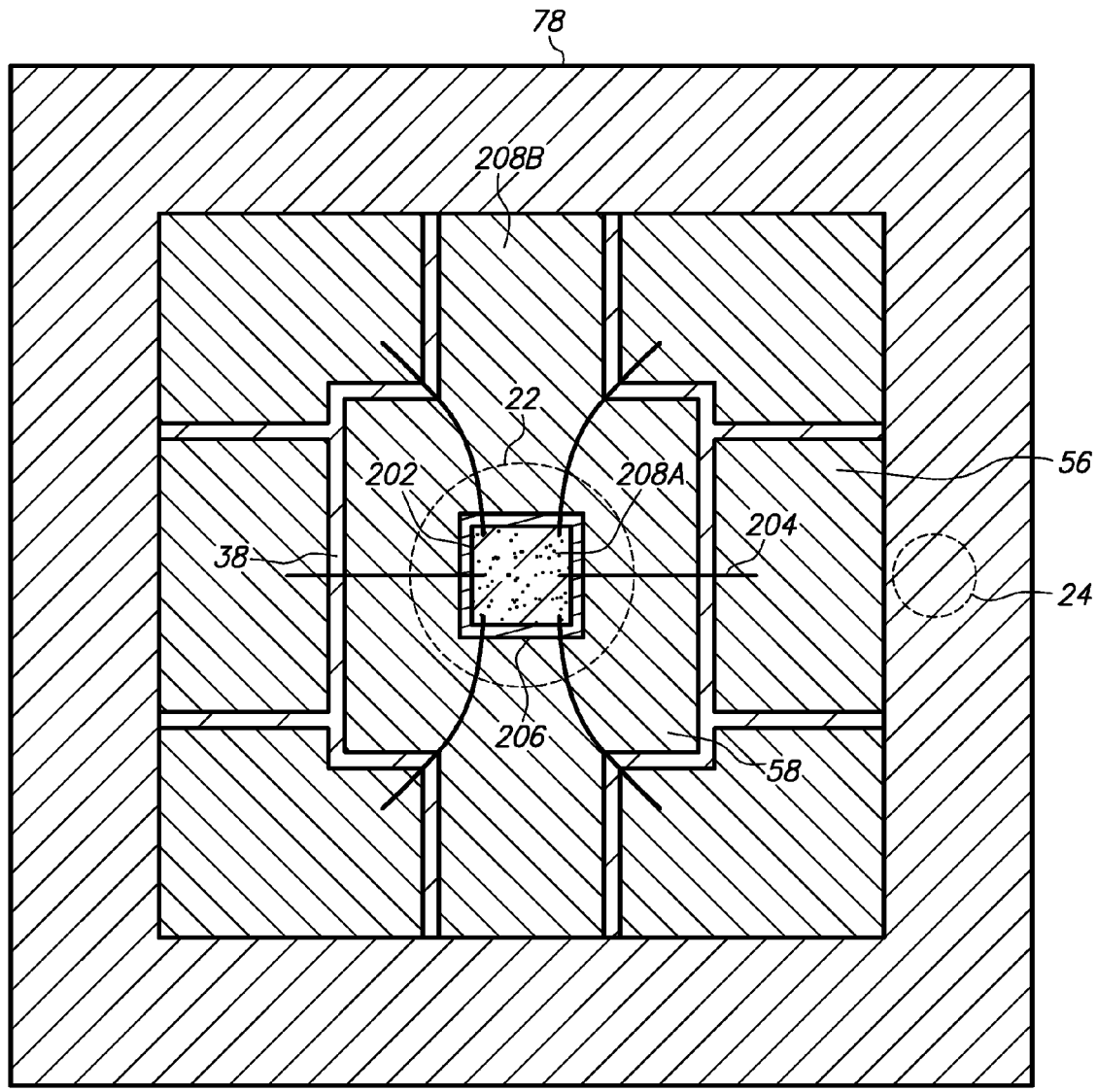
Figure 10C:
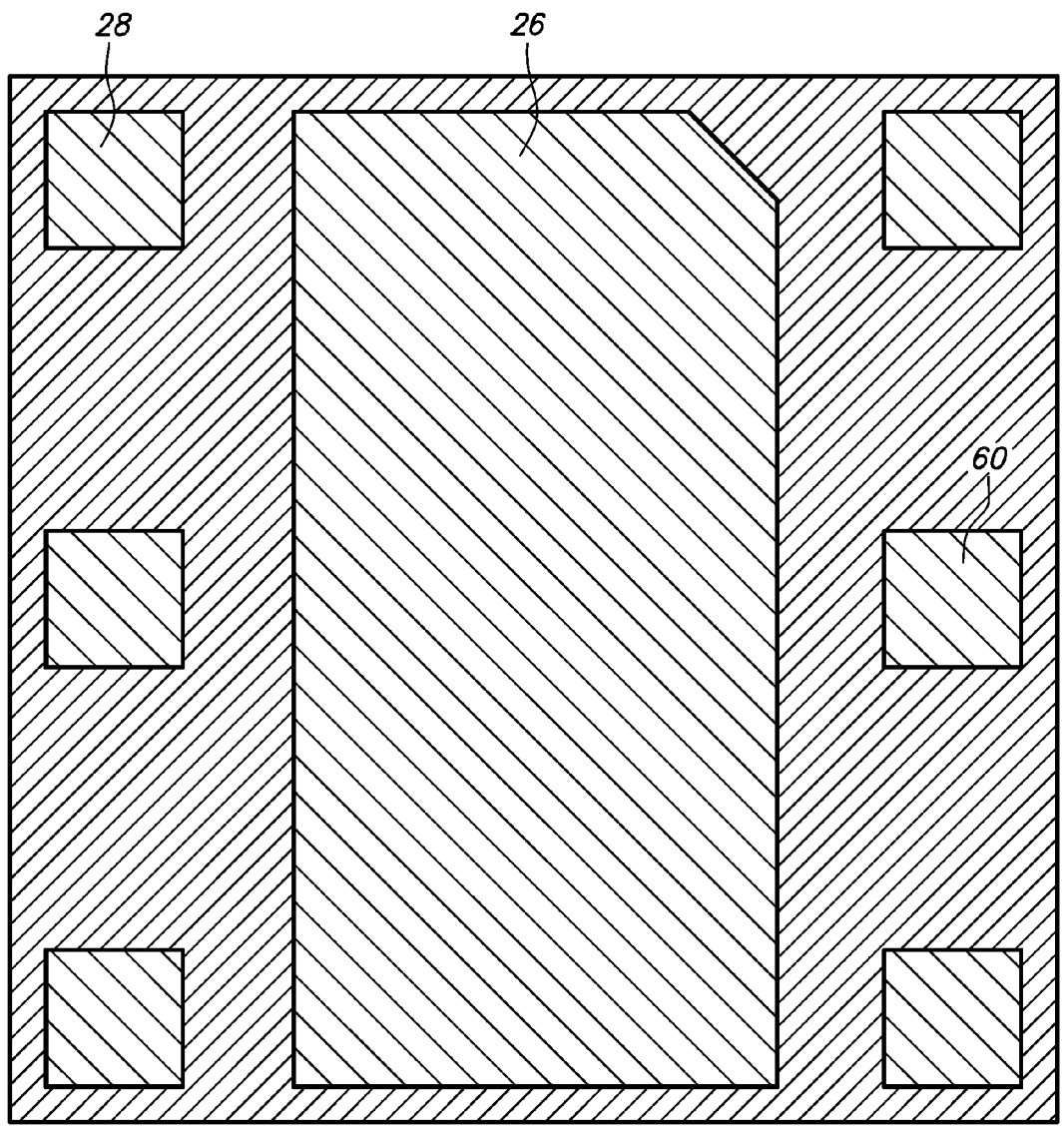

FIGS. 10A, 10B and 10C are cross-sectional, top and bottom views, respectively, of a semiconductor chip assembly that includes a thermal board with a rim, a semiconductor device and dual encapsulants in accordance with an embodiment of the present invention.

In this embodiment, the transparent encapsulant is contained by the rim. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 88, LED chip 202, wire bond 204, die attach 206 and encapsulants 208 and 210. LED chip 202 includes top surface 212, bottom surface 214 and bond pad 216. Top surface 212 is the active surface and includes bond pad 216 and bottom surface 214 is the thermal contact surface.

LED chip 202 is mounted on heat spreader 70, electrically connected to substrate 34 and thermally connected to heat spreader 70. In particular, LED chip 202 is mounted on thermal post 22, located within cavity 68 in thermal post 22 below cap 58, overlaps thermal post 22 but does not overlap substrate 34 or conductive trace 62, is laterally surrounded by thermal post 22 and adhesive 28, is electrically connected to conductive trace 62 by wire bond 204 and is thermally connected to and mechanically attached to thermal post 22 by die attach 206.

LED chip 202 emits blue light, color-shifting encapsulant 208 converts the blue light to white light which in turn radiates through transparent encapsulant 210 and assembly 200 is a white light source.

Semiconductor chip assembly 200 can be manufactured by mounting LED chip 202 on thermal post 22 using die attach 206, then wire bonding pads 56 and 216, then forming encapsulant 208 by depositing and curing using cavity 68 as a dam and then forming encapsulant 210 by depositing and curing using rim 78 as a dam.

Semiconductor chip assembly 200 is a first-level single-chip package.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the substrate can include single-level conductive traces and multi-level conductive traces. The thermal board can include multiple posts arranged in an array for multiple semiconductor devices and can include additional conductive traces to accommodate the additional semiconductor devices. The thermal board can also include a solder mask that extends above and selectively exposes the pad and the cavity and a rim mounted on the solder mask. Likewise, the semiconductor device can be an LED package with multiple LED chips and the thermal board can include additional conductive traces to accommodate the additional LED chips. A color-shifting encapsulant can extend laterally from the cavity and cover the wire bond and a transparent encapsulant can be laterally confined to the cavity and not cover the wire bond.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the thermal post and the substrate can include additional conductive traces to receive and route additional wire bonds to the chips. This may be more cost effective than providing a miniature thermal post for each chip.

The semiconductor device can extend into the cavity. For instance, the semiconductor device can extend into and slightly above the cavity. In this instance, most but not all of the semiconductor device is located inside the cavity and the semiconductor device extends within and outside the cavity. Alternatively, the semiconductor device can be located within the cavity. In this instance, all of the semiconductor device is located inside the cavity. In any case, the semiconductor device extends into the cavity regardless of whether most or all of the semiconductor device is located within the cavity.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a thermal post and base that are integral with one another and a cap that is metallurgically bonded and thermally connected to the thermal post, thereby enhancing reliability and reducing cost. The cap can be coplanar with the pad, thereby facilitating the electrical, thermal and mechanical connections with the semiconductor device. Furthermore, the thermal post can be customized for the semiconductor device and the base can be customized for the next level assembly, thereby enhancing the thermal connection from the semiconductor device to the next level assembly. For instance, the cavity can have a square or rectangular shape in a lateral plane with the same or similar topography as the thermal contact of the semiconductor device.

The heat spreader can be electrically connected to or isolated from the semiconductor device and the substrate. For instance, the die attach can be electrically conductive, or the second conductive layer on the grinded surface can include a routing line that extends across the adhesive between the substrate and the cap and electrically connects the semiconductor device to the heat spreader. Thereafter, the heat spreader can be electrically connected to ground, thereby electrically connecting the semiconductor device to ground.

The heat spreader can be copper, aluminum, copper/nickel/aluminum or other thermally conductive metallic structures.

The thermal post can be deposited on or integral with the base. The thermal post can be integral with the base when they are a single-piece metal such as copper or aluminum. The thermal post can also be integral with the base when they include a single-piece metal such as copper at their interface as well as additional metal elsewhere such as a solder upper post portion and a copper lower post portion and base. The thermal post can also be integral with the base when they share single-piece metals at their interface such as a copper coating on a nickel buffer layer on an aluminum core.

The signal post can be deposited on or integral with the terminal. The signal post can be integral with the terminal when they are a single-piece metal such as copper or aluminum. The signal post can also be integral with the terminal when they include a single-piece metal such as copper at their interface as well as additional metal elsewhere such as a solder upper post portion and a copper lower post portion and terminal. The signal post can also be integral with the terminal when they share single-piece metals at their interface such as a copper coating on a nickel buffer layer on an aluminum core.

The base can provide mechanical support for the substrate. For instance, the base can prevent the substrate from warping during metal grinding, chip mounting, wire bonding and encapsulant molding. Furthermore, the base can include fins at its backside that protrude in the downward direction. For instance, the base can be cut at its bottom surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The thermal post can be etched to form the cavity before or after the adhesive and the substrate are mounted on the base, before or after the adhesive is solidified, before, during or after the pad and/or the terminal is formed and before or after the solder masks are formed. Likewise, the metal plate can be etched to form the cavity before, during or after the thermal post is formed.

The cap can be formed by numerous deposition techniques including electroplating, electroless plating, evaporating and sputtering as a single layer or multiple layers after the adhesive is solidified, before, during or after the pad and/or the terminal is formed. The cap can be the same metal as the thermal post or the adjacent top of the thermal post. Furthermore, the cap can extend across the aperture to the substrate or reside within the periphery of the aperture. Thus, the cap may contact or be spaced from the substrate. In any case, the cap extends laterally from the top of the thermal post in the lateral directions.

The adhesive can provide a robust mechanical bond between the heat spreader and the substrate. For instance, the adhesive can extend laterally from the thermal post beyond the conductive trace to the peripheral edges of the assembly, the adhesive can fill the space between the heat spreader and the substrate and the adhesive can be void-free with consistent bond lines. The adhesive can also absorb thermal expansion mismatch between the heat spreader and the substrate. Furthermore, the adhesive can be a low cost dielectric that need not have high thermal conductivity. Moreover, the adhesive is not prone to delamination.

The adhesive thickness can be adjusted so that the adhesive essentially fills the gaps and essentially all the adhesive is within structure once it is solidified and/or grinded. For instance, the optimal prepreg thickness can be established through trial and error. Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the apertures can be formed in the conductive layer and then the conductive layer can be mounted on the adhesive so that the conductive layer contacts the adhesive and is exposed in the upward direction and the posts extend into and are exposed in the upward direction by the apertures. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the adhesive. For instance, the conductive layer can be provided on the dielectric layer, then the apertures can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the posts extend into and are exposed in the upward directions by the apertures. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the apertures can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the posts are aligned with the apertures and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned to provide the conductive trace. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad and the cap can be coplanar at their top surfaces, thereby enhancing solder joints between the semiconductor device and the thermal board by controlling solder ball collapse.

The pad can be formed by numerous deposition techniques including electroplating, electroless plating, evaporating and sputtering as a single layer or multiple layers, either before or after the substrate is mounted on the adhesive. For instance, the conductive layer can be patterned on the substrate before it is mounted on the adhesive or after it is attached to the posts and the base by the adhesive.

The plated contact surface finish can be formed before or after the pad and the terminal are formed. For instance, the plated layer can be deposited on the metal plate before it is etched. Alternatively, the plated layer can be deposited on the second conductive layer and then patterned using the etch mask that defines the pad and the cap.

The rim can be reflective or non-reflective and transparent or non-transparent. For instance, the rim can include a highly reflective metal such as silver or aluminum with a slanted inner surface which reflects the light directed at it in the upward direction, thereby increasing light output in the upward direction. Likewise, the rim can include a transparent material such as glass or a non-reflective, non-transparent low cost material such as epoxy. Furthermore, a reflective rim can be used regardless of whether it contacts or confines the encapsulant.

The encapsulant (or dual encapsulants) can be numerous transparent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

A lens can overlap or replace the encapsulant. The lens can provide environmental protection such as moisture resistance and particle protection for the chip and the wire bond in a sealed enclosure. The lens can also provide a convex refractive surface that focuses the light in the upward direction. The lens can be numerous transparent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, vias, signal posts and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The cap, dielectric layer, plated contacts, solder masks, rim, encapsulants and second conductive layer on the grinded surface are generally desirable but may be omitted in some embodiments. For instance, if single-level signal routing is used then the dielectric layer may be omitted to reduce cost. If the LED chip emits light with the desired color then the color-shifting encapsulant can be omitted. Likewise, if the transparent encapsulant is molded on the thermal board, laterally confined by the cavity or omitted and a reflector is unnecessary then the rim can be omitted.

The thermal board can include a thermal via that is spaced from the posts, extends through the dielectric layer and the adhesive outside the openings and the apertures and is adjacent to and thermally connects the base and the cap to improve heat dissipation from the cap to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive and a single substrate and then separated from one another. Likewise, numerous sets of heat spreaders and conductive traces that are each dedicated to a single semiconductor device can be simultaneously batch manufactured for each thermal board in the batch using a single metal plate, a single adhesive and a single substrate.

For example, multiple recesses can be etched in the metal plate to form multiple thermal posts and signal posts and the base, then the non-solidified adhesive with openings corresponding to the posts can be mounted on the base such that each post extends through an opening, then the substrate (with a single conductive layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate, then the adhesive can be cured and solidified, then the posts, the adhesive and the first conductive layer can be grinded to form a lateral top surface, then the second conductive layer can be plated on the posts, the adhesive and the first conductive layer, then the first and second conductive layers can be etched to form the pads and the caps corresponding to the thermal posts and the base can be etched to form the bases corresponding to the thermal posts and the terminals corresponding to the signal posts, then the thermal posts and the caps can be etched to form the cavities, then the plated contact surface finish can be formed on the thermal posts, the bases, the pads, the terminals and the caps and then the substrate and the adhesive can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, die attach paste portions can be deposited in the cavities on the thermal posts, then the chips can be placed in the cavities on the die attach paste portions, then the die attach paste portions can be simultaneously heated and hardened to provide the die attaches, then the chips can be wired bonded to the corresponding pads outside the cavities, then color-shifting encapsulant portions can be deposited into the cavities on the chips and the wire bonds, then the color-shifting encapsulant portions can be simultaneously heated and hardened to provide the color-shifting encapsulants, then transparent encapsulants can be simultaneously molded over the color-shifting encapsulants and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the thermal post is adjacent to the base regardless of whether the thermal post is formed additively or subtractively.

The term "overlap" refers to above and extending within a periphery of an underlying element. Overlap includes extending inside and outside the periphery or residing within the periphery. For instance, the semiconductor device overlaps the thermal post since an imaginary vertical line intersects the semiconductor device and the thermal post, regardless of whether another element such as the die attach is between the semiconductor device and the thermal post and is intersected by the line, and regardless of whether another imaginary vertical line intersects the thermal post but not the semiconductor device (outside the periphery of the semiconductor device). Likewise, the adhesive overlaps the base and is overlapped by the pad, and the base is overlapped by the thermal post. Likewise, the thermal post overlaps and is within a periphery of the base. Moreover, overlap is synonymous with over and overlapped by is synonymous with under or beneath.

The term "contact" refers to direct contact. For instance, the dielectric layer contacts the pad but does not contact the thermal post or the base.

The term "cover" refers to complete coverage in the upward, downward and/or lateral directions. For instance, the base covers the thermal post in the downward direction but the thermal post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The terms "opening" and "aperture" refer to a through-hole and are synonymous. For instance, the thermal post is exposed by the adhesive in the upward direction when it is inserted into the opening in the adhesive. Likewise, the thermal post is exposed by the substrate in the upward direction when it is inserted into the aperture in the substrate.

The term "inserted" refers to relative motion between elements. For instance, the thermal post is inserted into the aperture regardless of whether the thermal post is stationary and the substrate moves towards the base, the substrate is stationary and the thermal post moves towards the substrate or the thermal post and the substrate both approach the other. Furthermore, the thermal post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the thermal post is aligned with the aperture when the adhesive is mounted on the base, the substrate is mounted on the adhesive, the thermal post is inserted into and aligned with the opening and the aperture is aligned with the opening regardless of whether the thermal post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the thermal post and the dielectric layer in the gap refers to the adhesive in the gap that contacts and is sandwiched between the thermal post at the inner sidewall of the gap and the dielectric layer at the outer sidewall of the gap.

The term "above" refers to upward extension and includes adjacent and non-adjacent elements as well as overlapping and non-overlapping elements. For instance, the thermal post extends above, is adjacent to, overlaps and protrudes from the base. Likewise, the thermal post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the thermal post. Likewise, the thermal post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the thermal post extends vertically above the base in the upward direction and the adhesive extends vertically below the pad in the downward direction regardless of whether the assembly is inverted and/or mounted on a heat sink. Likewise, the base extends "laterally" from the thermal post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:
   providing a thermal post, a signal post, a base, an adhesive and a conductive layer, wherein
      the thermal post is adjacent to the base, extends above the base in an upward direction, extends into a first opening in the adhesive and is aligned with a first aperture in the conductive layer,
      the signal post is adjacent to the base, extends above the base in the upward direction, extends into a second opening in the adhesive and is aligned with a second aperture in the conductive layer,
      the base extends below the posts in a downward direction opposite the upward direction and extends laterally from the posts in lateral directions orthogonal to the upward and downward directions,
      the adhesive is mounted on and extends above the base, is sandwiched between the base and the conductive layer and is non-solidified, and
      the conductive layer is mounted on and extends above the adhesive; then
   flowing the adhesive into and upward in a first gap located in the first aperture between the thermal post and the conductive layer and in a second gap located in the second aperture between the signal post and the conductive layer;
   solidifying the adhesive;
   providing a conductive trace that includes a pad, a terminal and the signal post, wherein the pad includes a selected portion of the conductive layer and an electrically conductive path between the pad and the terminal includes the signal post;
   mounting a semiconductor device on a heat spreader that includes the thermal post and the base, wherein the semiconductor device extends into a cavity and is covered by the cavity in the downward direction, and the cavity is defined by and laterally surrounded by the heat spreader, extends into the thermal post, faces in the upward direction and is covered by the base in the downward direction;
   electrically connecting the semiconductor device to the pad, thereby electrically connecting the semiconductor device to the terminal; and
   thermally connecting the semiconductor device to the thermal post and, the base.

2. The method of claim 1, wherein providing the thermal post, the signal post and the base includes:
   providing a metal plate;
   forming an etch mask on the metal plate that selectively exposes the metal plate and defines the posts;

etching the metal plate in a pattern defined by the etch mask, thereby forming a recess in the metal plate that extends into but not through the metal plate; and then removing the etch mask, wherein the thermal post includes a first unetched portion of the metal plate that protrudes above the base and is laterally surrounded by the recess, the signal post includes a second unetched portion of the metal plate that protrudes above the base and is laterally surrounded by the recess, and the base includes an unetched portion of the metal plate below the posts and the recess.

3. The method of claim 1, wherein:

providing the adhesive includes providing a prepreg with uncured epoxy;

flowing the adhesive includes melting the uncured epoxy and compressing the uncured epoxy between the base and the conductive layer; and solidifying the adhesive includes curing the uncured epoxy.

4. The method of claim 1, wherein flowing the adhesive includes filling the gaps with the adhesive.

5. The method of claim 1, wherein mounting the conductive layer includes mounting the conductive layer alone on the adhesive.

6. The method of claim 1, wherein mounting the conductive layer includes mounting the conductive layer and a dielectric layer on the adhesive.

7. The method of claim 1, wherein providing the pad includes removing selected portions of the conductive layer after solidifying the adhesive.

8. The method of claim 1, wherein providing the pad includes:

grinding the posts, the adhesive and the conductive layer such that the posts, the adhesive and the conductive layer are laterally aligned with one another at a top lateral surface that faces in the upward direction; and then removing selected portions of the conductive layer using an etch mask that defines the pad.

9. The method of claim 1, wherein providing the terminal includes removing selected portions of the base after solidifying the adhesive.

10. The method of claim 1, wherein mounting the semiconductor device includes providing a die attach between the semiconductor device and the thermal post, electrically connecting the semiconductor device includes providing a wire bond between the semiconductor device and the pad, and thermally connecting the semiconductor device includes providing the die attach between the semiconductor device and the thermal post.

11. A method of making a semiconductor chip assembly, comprising:

providing a thermal post, a signal post and a base, wherein the thermal post is adjacent to and integral with the base and extends above the base in an upward direction, the signal post is adjacent to and integral with the base and extends above the base in the upward direction, and the base extends below the posts in a downward direction opposite the upward direction and extends laterally from the posts in lateral directions orthogonal to the upward and downward directions;

providing an adhesive, wherein first and second openings extend through the adhesive;

providing a conductive layer, wherein first and second apertures extend through the conductive layer;

mounting the adhesive on the base, including inserting the thermal post into the first opening and the signal post into the second opening, wherein the adhesive extends above the base, the thermal post extends into the first opening and the signal post extends into the second opening;

mounting the conductive layer on the adhesive, including aligning the thermal post with the first aperture and the signal post with the second aperture, wherein the conductive layer extends above the adhesive and the adhesive is sandwiched between the base and the conductive layer and is non-solidified; then applying heat to melt the adhesive;

moving the base and the conductive layer towards one another, thereby moving the thermal post upward in the first aperture, moving the signal post upward in the second aperture and applying pressure to the molten adhesive between the base and the conductive layer, wherein the pressure forces the molten adhesive to flow into and upward in a first gap located in the first aperture between the thermal post and the conductive layer and in a second gap located in the second aperture between the signal post and the conductive layer;

applying heat to solidify the molten adhesive, thereby mechanically attaching the posts and the base to the conductive layer; then providing a conductive trace that includes a pad, a terminal and the signal post, wherein the pad includes a selected portion of the conductive layer and an electrically conductive path between the pad and the terminal includes the signal post;

mounting a semiconductor device on a heat spreader that includes the thermal post and the base, wherein the semiconductor device extends into a cavity and is covered by the cavity in the downward direction, and the cavity is defined by and laterally surrounded by the heat spreader, extends into the thermal post, faces in the upward direction and is covered by the base in the downward direction;

electrically connecting the semiconductor device to the pad, thereby electrically connecting the semiconductor device to the terminal; and thermally connecting the semiconductor device to the thermal post and, the base.

12. The method of claim 11, wherein providing the thermal post, the signal post and the base includes:

providing a metal plate;

forming an etch mask on the metal plate that selectively exposes the metal plate and defines the posts;

etching the metal plate in a pattern defined by the etch mask, thereby forming a recess in the metal plate that extends into but not through the metal plate; and then removing the etch mask, wherein the thermal post includes a first unetched portion of the metal plate that protrudes above the base and is laterally surrounded by the recess, the signal post includes a second unetched portion of the metal plate that protrudes above the base and is laterally surrounded by the recess, and the base includes an unetched portion of the metal plate below the posts and the recess.

13. The method of claim 11, wherein:

providing the adhesive includes providing a prepreg with uncured epoxy;

flowing the adhesive includes melting the uncured epoxy and compressing the uncured epoxy between the base and the conductive layer; and solidifying the adhesive includes curing the uncured epoxy.

14. The method of claim 11, wherein mounting the conductive layer includes mounting the conductive layer alone on the adhesive.

15. The method of claim 11, wherein mounting the conductive layer includes mounting the conductive layer and a dielectric layer on the adhesive.

16. The method of claim 11, wherein providing the pad includes removing selected portions of the conductive layer using an etch mask that defines the pad after solidifying the adhesive.

17. The method of claim 11, wherein providing the terminal includes removing selected portions of the base after solidifying the adhesive.

18. The method of claim 11, wherein providing the cavity includes etching a metal plate before solidifying the adhesive.

19. The method of claim 11, wherein providing the cavity includes etching the thermal post after solidifying the adhesive.

20. The method of claim 11, wherein mounting the semiconductor device includes providing a die attach between the semiconductor device and the thermal post, electrically connecting the semiconductor device includes providing a wire bond between the semiconductor device and the pad, and thermally connecting the semiconductor device includes providing the die attach between the semiconductor device and the thermal post.

21. A method of making a semiconductor chip assembly, comprising:
  providing a thermal post, a signal post, a base, an adhesive and a substrate, wherein
    the thermal post is adjacent to the base, extends above the base in an upward direction, extends through a first opening in the adhesive and extends into a first aperture in the substrate,
    the signal post is adjacent to the base, extends above the base in the upward direction, extends through a second opening in the adhesive and extends into a second aperture in the substrate,
    the base extends below the posts in a downward direction opposite the upward direction and extends laterally from the posts in lateral directions orthogonal to the upward and downward directions,
    the adhesive is mounted on and extends above the base, is sandwiched between the base and the substrate and is non-solidified, and
    the substrate is mounted on and extends above the adhesive, wherein the substrate includes a conductive layer and a dielectric layer and the conductive layer extends above the dielectric layer; then
  flowing the adhesive into and upward in a first gap located in the first aperture between the thermal post and the substrate and in a second gap located in the second aperture between the signal post and the substrate;
  solidifying the adhesive; then
  providing a conductive trace that includes a pad, a terminal and the signal post, wherein the pad includes a selected portion of the conductive layer and an electrically conductive path between the pad and the terminal includes the signal post;
  mounting a semiconductor device on the thermal post, wherein a heat spreader includes the thermal post and the base and the semiconductor device extends into a cavity and is covered by the cavity in the downward direction, and the cavity is defined by and laterally surrounded by the heat spreader, extends into the thermal post, faces in the upward direction and is covered by the base in the downward direction;
  electrically connecting the semiconductor device to the pad, thereby electrically connecting the semiconductor device to the terminal; and
  thermally connecting the semiconductor device to the thermal post and, the base.

22. The method of claim 21, wherein providing the thermal post, the signal post and the base includes:
  providing a metal plate;
  forming an etch mask on the metal plate that selectively exposes the metal plate and defines the posts;
  etching the metal plate in a pattern defined by the etch mask, thereby forming a recess in the metal plate that extends into but not through the metal plate; and then
  removing the etch mask, wherein the thermal post includes a first unetched portion of the metal plate that protrudes above the base and is laterally surrounded by the recess, the signal post includes a second unetched portion of the metal plate that protrudes above the base and is laterally surrounded by the recess, and the base includes an unetched portion of the metal plate below the posts and the recess.

23. The method of claim 21, wherein:
  providing the adhesive includes providing a prepreg with uncured epoxy;
  flowing the adhesive includes melting the uncured epoxy and compressing the uncured epoxy between the base and the substrate; and
  solidifying the adhesive includes curing the uncured epoxy.

24. The method of claim 21, wherein flowing the adhesive includes filling the gaps with the adhesive.

25. The method of claim 21, wherein providing the pad includes removing selected portions of the conductive layer after solidifying the adhesive.

26. The method of claim 21, wherein providing the pad includes:
  grinding the posts, the adhesive and the conductive layer such that the posts, the adhesive and the conductive layer are laterally aligned with one another at a top lateral surface that faces in the upward direction; and then
  removing selected portions of the conductive layer using an etch mask that defines the pad.

27. The method of claim 21, wherein providing the terminal includes removing selected portions of the base after solidifying the adhesive.

28. The method of claim 21, wherein providing the terminal includes:
  forming an etch mask after solidifying the adhesive and before mounting the semiconductor device;
  etching the base in a pattern defined by the etch mask; and then
  removing the etch mask, wherein the terminal includes an unetched portion of the base that is adjacent to the signal post and is spaced and separated from and no longer part of the base.

29. The method of claim 21, wherein providing the cavity includes etching the thermal post after solidifying the adhesive.

30. The method of claim 21, wherein mounting the semiconductor device includes providing a die attach between the semiconductor device and the thermal post, electrically connecting the semiconductor device includes providing a wire bond between the semiconductor device and the pad, and thermally connecting the semiconductor device includes providing the die attach between the semiconductor device and the thermal post.

31. A method of making a semiconductor chip assembly, comprising:

provning a thermal post, a signal post and a base, wherein the thermal post is adjacent to and integral with the base and extends above the base in an upward direction, the signal post is adjacent to and integral with the base and extends above the base in the upward direction, and the base extends below the posts in a downward direction opposite the upward direction and extends laterally from the posts in lateral directions orthogonal to the upward and downward directions;

providing an adhesive, wherein first and second openings extend through the adhesive;

providing a substrate that includes a conductive layer and a dielectric layer, wherein first and second apertures extend through the substrate;

mounting the adhesive on the base, including inserting the thermal post into the first opening and the signal post into the second opening, wherein the adhesive extends above the base, the thermal post extends through the first opening and the signal post extends through the second opening;

mounting the substrate on the adhesive, including inserting the thermal post into the first aperture and the signal post into the second aperture, wherein the substrate extends above the adhesive, the conductive layer extends above the dielectric layer and the adhesive is sandwiched between the base and the substrate and is non-solidified; then applying heat to melt the adhesive;

moving the base and the substrate towards one another, thereby moving the thermal post upward in the first aperture, moving the signal post upward in the second aperture and applying pressure to the molten adhesive between the base and the substrate, wherein the pressure forces the molten adhesive to flow into and upward in a first gap located in the first aperture between the thermal post and the substrate and in a second gap located in the second aperture between the signal post and the substrate;

applying heat to solidify the molten adhesive, thereby mechanically attaching the posts and the base to the substrate; then providing a conductive trace that includes a pad, a terminal and the signal post, wherein the pad includes a selected portion of the conductive layer and an electrically conductive path between the pad and the terminal includes the signal post;

mounting a semiconductor device on a heat spreader that includes the thermal post and the base, wherein the semiconductor device extends into a cavity and is covered by the cavity in the downward direction, and the cavity is defined by and laterally surrounded by the heat spreader, extends into the thermal post, faces in the upward direction and is covered by the thermal post and the base in the downward direction;

electrically connecting the semiconductor device to the pad, thereby electrically connecting the semiconductor device to the terminal; and thermally connecting the semiconductor device to the thermal post, thereby thermally connecting the semiconductor device to the base.

32. The method of claim 31, wherein providing the thermal post, the signal post and the base includes:

providing a metal plate;

forming an etch mask on the metal plate that selectively exposes the metal plate and defines the posts;

etching the metal plate in a pattern defined by the etch mask, thereby forming a recess in the metal plate that extends into but not through the metal plate; and then removing the etch mask, wherein the thermal post includes a first unetched portion of the metal plate that protrudes above the base and is laterally surrounded by the recess, the signal post includes a second unetched portion of the metal plate that protrudes above the base and is laterally surrounded by the recess, and the base includes an unetched portion of the metal plate below the posts and the recess.

33. The method of claim 31, wherein:

providing the adhesive includes providing a prepreg with uncured epoxy;

flowing the adhesive includes melting the uncured epoxy and compressing the uncured epoxy between the base and the substrate; and solidifying the adhesive includes curing the uncured epoxy.

34. The method of claim 31, wherein providing the pad and the terminal includes:

grinding the posts, the adhesive and the conductive layer such that the posts, the adhesive and the conductive layer are laterally aligned with one another at a top lateral surface that faces in the upward direction; then removing selected portions of the conductive layer using a first etch mask that defines the pad, wherein the pad includes an unetched portion of the conductive layer; and removing selected portions of the base using a second etch mask that defines the terminal, wherein the terminal includes an unetched portion of the base that is adjacent to the signal post and is spaced and separated from and no longer part of the base.

35. The method of claim 31, wherein mounting the semiconductor device includes providing a die attach between the semiconductor device and the thermal post, electrically connecting the semiconductor device includes providing a wire bond between the semiconductor device and the pad, and thermally connecting the semiconductor device includes providing the die attach between the semiconductor device and the thermal post.

* * * * *